United States Patent
Wu et al.

(10) Patent No.: US 12,252,777 B2
(45) Date of Patent: Mar. 18, 2025

(54) PHYSICAL VAPOR DEPOSITION (PVD) SYSTEM AND METHOD OF PROCESSING TARGET

(71) Applicant: TAIWAN SEMICONDUCTOR MANUFACTURING COMPANY LIMITED, Hsin-Chu (TW)

(72) Inventors: Sheng-Ying Wu, Taichung (TW); Ming-Hsien Lin, Taichung (TW); Po-Wei Wang, Taichung (TW); Hsiao-Feng Lu, Taichung (TW)

(73) Assignee: TAIWAN SEMICONDUCTOR MANUFACTURING COMPANY LIMITED, Hsin-Chu (TW)

( * ) Notice: Subject to any disclaimer, the term of this patent is extended or adjusted under 35 U.S.C. 154(b) by 508 days.

(21) Appl. No.: 17/314,261

(22) Filed: May 7, 2021

(65) Prior Publication Data

US 2022/0356560 A1  Nov. 10, 2022

(51) Int. Cl.
*C23C 14/34* (2006.01)
*C23C 14/02* (2006.01)
*C23C 14/54* (2006.01)
*C23C 14/56* (2006.01)
*H01J 37/34* (2006.01)

(52) U.S. Cl.
CPC .......... *C23C 14/541* (2013.01); *C23C 14/028* (2013.01); *C23C 14/3407* (2013.01); *C23C 14/564* (2013.01); *H01J 37/3414* (2013.01)

(58) Field of Classification Search
CPC ........ H01J 37/3414; H01J 37/34–3497; C23C 14/34–46
See application file for complete search history.

(56) References Cited

U.S. PATENT DOCUMENTS

| 5,470,451 | A  | * | 11/1995 | Kobayashi | H01J 37/3441 204/298.11 |
| 6,073,830 | A  | * | 6/2000  | Hunt      | B23K 20/023 228/205 |
| 2002/0029093 | A1 | * | 3/2002  | Miller    | H01L 21/76843 700/121 |
| 2003/0092278 | A1 | * | 5/2003  | Fink      | H01J 37/32633 438/709 |
| 2004/0262155 | A1 | * | 12/2004 | Lombardi  | H01J 37/32633 204/298.01 |

(Continued)

FOREIGN PATENT DOCUMENTS

| CN | 110211858 A | * | 9/2019 | ........ H01J 37/32935 |

*Primary Examiner* — Aiden Lee
(74) *Attorney, Agent, or Firm* — Cooper Legal Group, LLC

(57) ABSTRACT

A physical vapor deposition (PVD) system is provided. The PVD system includes a PVD chamber defining a PVD volume within which a target material of a target is deposited onto a wafer. The PVD system includes the target in the PVD chamber. The target is configured to overlie the wafer. An edge of the target extends from a first surface of the target to a second surface of the target, opposite the first surface of the target. A first portion of the edge of the target has a first surface roughness. The first portion of the edge of the target extends at most about 6 millimeters from the first surface of the target to a second portion of the edge of the target. The second portion of the edge of the target has a second surface roughness less than the first surface roughness.

20 Claims, 15 Drawing Sheets

(56) References Cited

U.S. PATENT DOCUMENTS

| | | | |
|---|---|---|---|
| 2006/0070876 A1* | 4/2006 | Wu | H01J 37/3423 |
| | | | 204/192.12 |
| 2006/0266643 A1* | 11/2006 | Le | C23C 14/3407 |
| | | | 204/298.12 |
| 2007/0125646 A1* | 6/2007 | Young | H01J 37/3423 |
| | | | 204/298.12 |
| 2009/0090620 A1* | 4/2009 | Pavloff | H01J 37/3405 |
| | | | 204/298.12 |
| 2017/0229295 A1* | 8/2017 | Kim | H01J 37/3491 |
| 2018/0171465 A1* | 6/2018 | Kim | C23C 14/028 |

\* cited by examiner

PHYSICAL VAPOR DEPOSITION (PVD) SYSTEM AND METHOD OF PROCESSING TARGET

BACKGROUND

Semiconductor wafers are used in a multitude of electronic devices, such as mobile phones, laptops, desktops, tablets, watches, gaming systems, and various other industrial, commercial, and consumer electronics. Semiconductor wafers generally undergo one or more treatments to produce desired features.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
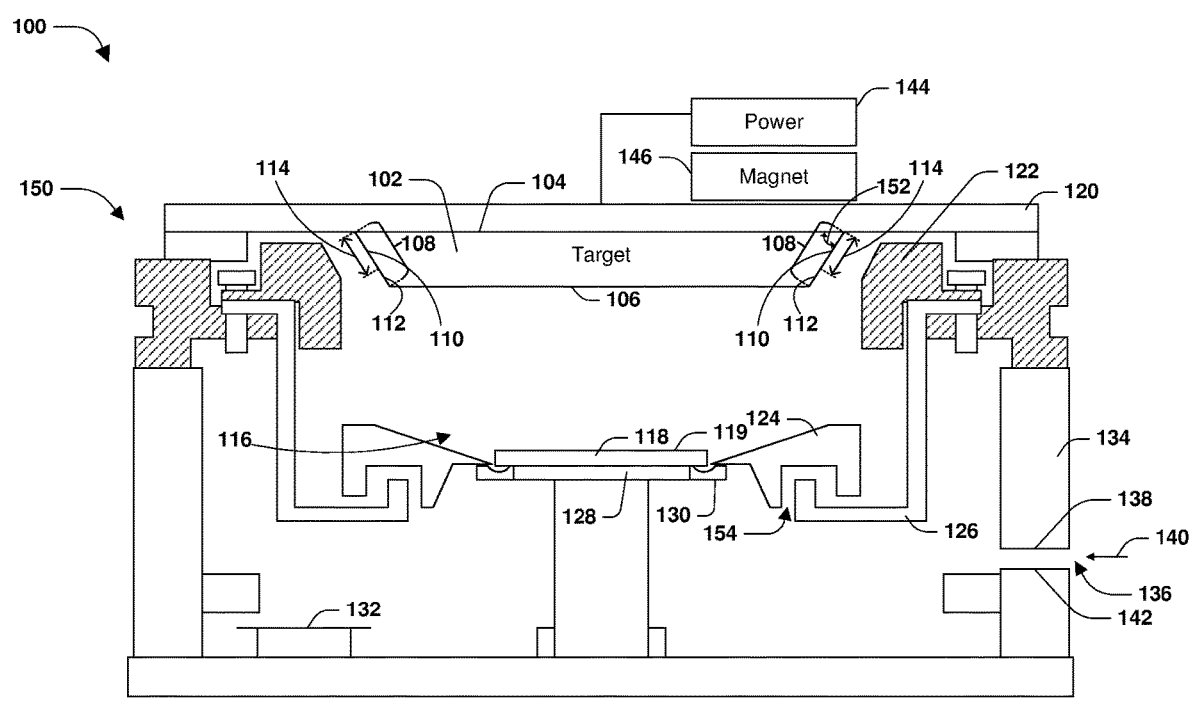
FIG. 1 illustrates a cross-sectional view of at least some of a physical vapor deposition (PVD) system, in accordance with some embodiments.

The following disclosure provides several different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals or letters in the various examples. This repetition is for the purpose of simplicity and clarity and does not in itself dictate a relationship between the various embodiments or configurations discussed.

Further, spatially relative terms, such as "beneath," "below," "lower," "above," "upper" and the like, may be used herein for ease of description to describe one element or feature's relationship to other element(s) or feature(s) as illustrated in the figures. The spatially relative terms are intended to encompass different orientations of the device in use or operation in addition to the orientation illustrated in the figures. The apparatus may be otherwise oriented (rotated 90 degrees or at other orientations) and the spatially relative descriptors used herein may likewise be interpreted accordingly.

A physical vapor deposition (PVD) system has a PVD chamber defining a PVD volume within which a target material of a target is deposited onto a wafer. An edge of the target extends from a first surface of the target to a second surface of the target, opposite the first surface of the target. A first portion of the edge of the target has a first surface roughness. The first portion of the edge of the target extends at most a first distance from the first surface of the target to a second portion of the edge of the target. The first distance is at most about 6 millimeters. The second portion of the edge of the target has a second surface roughness less than the first surface roughness. Limiting the extension of the first portion of the edge of the target (from the first surface of the target to the second portion of the edge of the target) to the first distance provides for a reduction in an amount of contaminants accumulating on one or more wafers during one or more PVD processes, as compared to other systems with a target having a rough portion that extends further than the first distance. Limiting the extension of the first portion of the edge of the target to the first distance provides for a reduction in an amount of arcing in the PVD chamber, as compared to other systems with a target having a rough portion that extends further than the first distance. Given the reduction in the amount of contaminants and/or the reduction in the amount of arcing, the PVD system operates more efficiently than other PVD systems, such as by inhibiting damage to one or more components of the PVD system, requiring less cleaning and/or maintenance of the PVD chamber, yielding fewer wafer defects in wafers, etc.

The PVD chamber comprises an inlet to introduce a first gas into the PVD chamber. In some embodiments, the PVD system comprises a gas conducting structure in the PVD chamber to conduct the first gas into the PVD volume. In some embodiments, the gas conducting structure provides for an increased uniformity of flow and/or distribution of the first gas into the PVD volume, as compared to other systems that do not have the gas conducting structure. Given the increased uniformity of flow and/or distribution of the first gas into the PVD volume, the PVD system establishes a plasma from the first gas with a more stable and/or uniform plasma concentration and/or plasma density throughout the PVD volume and/or under the target. Given the increased uniformity of flow and/or distribution of the first gas into the PVD volume and/or the more stable and/or uniform plasma concentration and/or plasma density, the PVD system provides for a reduction in an amount of arcing that occurs in the PVD volume, as compared to other systems that do not have the gas conducting structure. In some embodiments, the gas conducting structure in the PVD chamber provides for an increased concentration and/or density of the first gas in an upper region of the PVD volume, as compared to systems that do not have the gas conducting structure. In some embodiments, the gas conducting structure in the PVD chamber provides for an increased concentration and/or density of the plasma established in the upper region of the PVD volume, as compared to systems that do not have the gas conducing structure. The increased concentration and/or density of the first gas and/or the increased concentration and/or density of the plasma in the upper region provides for more efficient operation of the PVD system, such as an increased deposition rate during one or more PVD processes, such as due to an increase in bombardment force upon the target by the plasma.

Figure 2:
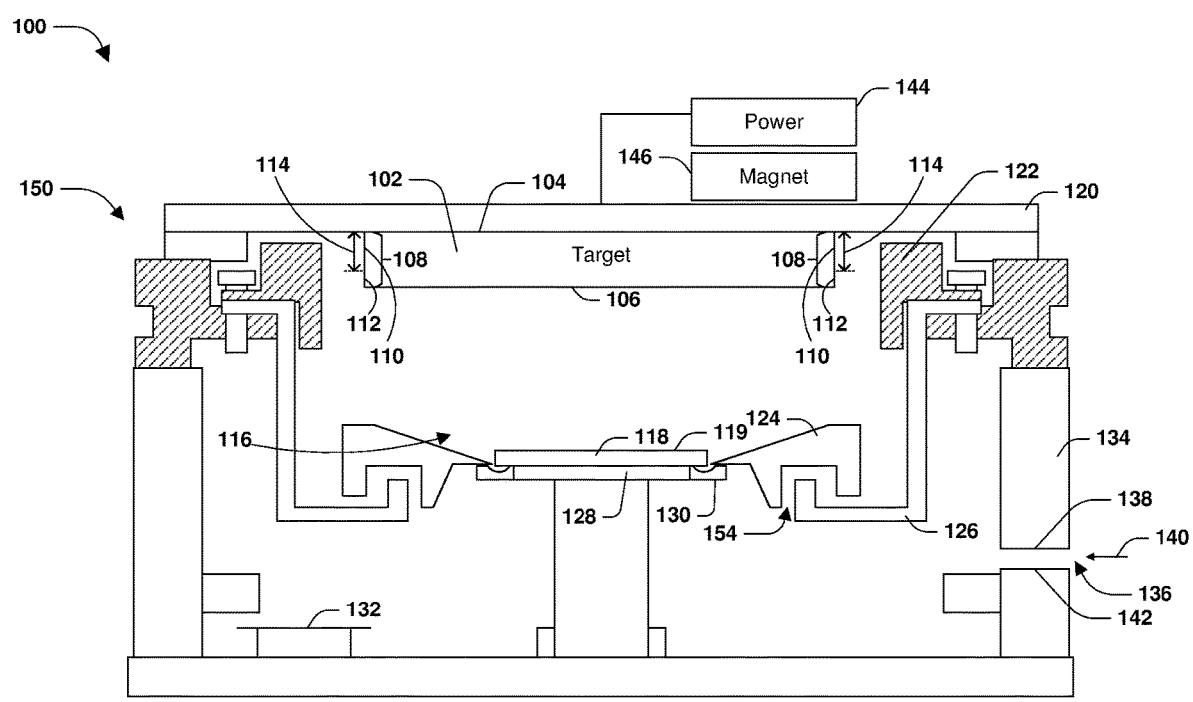
FIG. 2 illustrates a cross-sectional view of at least some of a PVD system, in accordance with some embodiments.

FIGS. 1-2 illustrate a PVD system 100 according to some embodiments. The views depicted in FIGS. 1-2 are cross-sectional views to illustrate some internal aspects of the PVD system 100. With respect to FIG. 1, the PVD system 100 comprises a PVD chamber 150 defining a PVD volume 116 within which a target material of a target 102 is deposited onto a wafer 118. In some embodiments, the PVD system 100 is configured to perform a PVD process to form a thin film on a surface 119 of the wafer 118, such as for fabrication of one or more semiconductor devices. The thin film comprises the target material. In some embodiments, the thin film is at least one of a metal hard mask (MHM) film or other suitable thin film.

The PVD system 100 comprises a wafer support 128 in the PVD chamber 150. The wafer support 128 is configured to support the wafer 118 in the PVD volume 116. The wafer support 128 comprises at least one of a wafer chuck, an electrostatic chuck, a pedestal, or other suitable structure. In some embodiments, the wafer support 128 comprises a heater configured to heat the wafer 118, such as during performance of the PVD process.

The PVD chamber 150 comprises an inlet 136 configured to introduce a first gas 140 into the PVD chamber 150. In some embodiments, the PVD chamber 150 is coupled to a tube at the inlet 136. The first gas 140 exits the tube and enters the PVD chamber 150 via the inlet 136. The inlet 136 corresponds to an opening defined in at least one of a chamber wall 134 of the PVD chamber 150 and/or other portion of the PVD chamber 150. In some embodiments, the inlet 136 is defined by a first sidewall 138 of the chamber wall 134 of the PVD chamber 150 and a second sidewall 142 of the chamber wall 134 of the PVD chamber 150. In some embodiments, the PVD system 100 comprises a first pump (not shown) configured to conduct the first gas 140 into the PVD chamber 150 via at least one of the tube or the inlet 136 of the PVD chamber 150. One or more valves, sealants, O-rings, etc. can exist at the inlet 136 to afford control over the flow of the first gas 140 from the tube to the PVD chamber 150. The first gas 140 comprises at least one of argon (Ar) or other suitable gas. In some embodiments, the PVD system 100 comprises a second pump 132 in the PVD chamber 150. The second pump 132 is at least one of a vacuum pump or other suitable pump. The second pump 132 configured to maintain a pressure of the first gas 140 in the PVD chamber 150, such as during the PVD process. In some embodiments, the PVD system 100 comprises a controller (not shown), such as a mass flow controller (MFC), configured to control a pressure of the first gas 140 in the PVD chamber 150. The controller controls at least one of the first pump, the one or more valves at the inlet 136, the second pump 132, or one or more other suitable components of the PVD system 100 based upon one or more signals received from one or more sensors of the PVD system 100. The one or more sensors comprise at least one of one or more pressure sensors (such as pressure gauges) or one or more other suitable sensors. The one or more pressure sensors comprise at least one of a pressure sensor positioned in or on the PVD chamber 150, a pressure sensor positioned in the PVD volume 116, a pressure sensor positioned in or on the first pump, a pressure sensor positioned in or on the second pump 132, a pressure sensor positioned in or on the tube, a pressure sensor positioned in or on the wafer support 128, a pressure sensor positioned on the chamber wall 134, a pressure sensor positioned in or on the inlet 136, or a pressure sensor positioned at another suitable location. The one or more pressure signals are indicative of one or more pressures. The controller controls at least one of the first pump, the one or more valves at the inlet 136, the second pump 132, or one or more other suitable components of the PVD system 100 based upon the one or more pressures. Other structures and/or configurations of the PVD chamber 150, the first pump, the second pump 132, the controller, and/or the inlet 136 are within the scope of the present disclosure.

The PVD chamber 150 comprises a backplane structure 120. The backplane structure 120 overlies the target 102. The target 102 is coupled to at least one of the backplane structure 120 or other portion of the PVD chamber 150 to maintain a position of the target 102 between the backplane structure 120 and the wafer 118. Other structures and/or configurations of the backplane structure 120, the target 102, and/or the PVD chamber 150 are within the scope of the present disclosure.

The PVD system 100 comprises at least one of a cover structure 124 (such as a cover ring), a shielding structure 126, or a deposition structure 130 (such as a deposition ring). The shielding structure 126 is configured to inhibit dissipation of the first gas 140 from the PVD volume 116. The PVD chamber 150 comprises an inner chamber wall 122 underlying the backplane structure 120. In some embodiments, the first gas 140 is conducted into the PVD volume 116 via a path 154 between the cover structure 124 and the shielding structure 126. Other structures and/or configurations of the cover structure 124, the shielding structure 126, the inner chamber wall 122, and/or the deposition structure 130 are within the scope of the present disclosure.

The target 102 comprises at least one of titanium (Ti), aluminum (Al), titanium nitride (TiN), titanium aluminum (TiAl), copper (Cu), cobalt (Co), aluminum copper (AlCu), copper aluminum (CuAl), copper manganese (CuMn), tantalum (Ta), or other suitable material. The target 102 overlies the wafer 118. An edge 108 of the target 102 extends from a first surface 104 of the target 102 to a second surface 106 of the target 102, opposite the first surface 104 of the target 102. The first surface 104 of the target 102 at least one of underlies, is in direct contact with, or is in indirect contact with the backplane structure 120. The second surface 106 of the target 102 faces the wafer 118. Other structures and/or configurations of the target 102 are within the scope of the present disclosure.

In some embodiments, the edge 108 of the target 102 is tapered at an angle 152 (shown in FIG. 1) with respect to the first surface 104 of the target 102. The edge 108 of the target 102 extends at the angle 152 from the first surface 104 of the target 102 to the second surface 106 of the target 102. In some embodiments, the edge 108 of the target 102 extends from the first surface 104 of the target 102 to the second surface 106 of the target 102 vertically and/or perpendicular to a direction of extension of at least one of the first surface 104 of the target 102 or the second surface 106 of the target 102 (shown in FIG. 2). Other structures and/or configurations of the target 102 are within the scope of the present disclosure.

A first portion 110 of the edge 108 of the target 102 has a first surface roughness. In some embodiments, the first portion 110 of the edge 108 of the target 102 is processed to achieve the first surface roughness. A second portion 112 of the edge 108 of the target 102 has a second surface roughness. The second surface roughness is less than the first surface roughness. The second surface roughness is about equal to or different than a third surface roughness of the second surface 106. The first portion 110 of the edge 108 of the target 102 is over the second portion 112 of the edge 108 of the target 102. The first portion 110 of the edge 108 of the target 102 extends at most a first distance 114 from the first surface 104 of the target 102 to the second portion 112 of the edge 108 of the target 102. The first distance 114 is at most about 6 millimeters (such as between about 2 millimeters to about 6 millimeters, such as between about 4 millimeters to about 6 millimeters, or such as between about 4 millimeters to about 5.5 millimeters). Other values of the first distance 114 are within the scope of the present disclosure. Other structures and/or configurations of the edge 108 of the target 102 are within the scope of the present disclosure. By providing for the first distance 114 of the extension of the first portion 110 of the edge 108 of the target 102 to be at least a minimum distance (such as about 4 millimeters) and/or at most a maximum distance (such as about 6 millimeters), the first portion 110 of the edge 108 of the target 102 inhibits accumulation of contaminants (such as particles) on one or more wafers during one or more PVD processes performed using the target 102, such as by capturing the contaminants due to the relatively increased first surface roughness.

The first surface roughness is between about 1 micrometer to about 30 micrometers (such as between about 3 micrometers to about 23 micrometers). The second surface roughness and/or the third surface roughness are at most about 3 micrometers (such as at most about 1.6 micrometers). Other values of the first surface roughness, the second surface roughness, and/or the third surface roughness are within the scope of the present disclosure.

In some embodiments, the target 102 comprises AlCu, a grain size of the target 102 is between about 20 micrometers to about 70 micrometers (such as between about 30 micrometers to about 50 micrometers), and/or the first surface roughness is between about 1 micrometer to about 10 micrometers (such as between about 3 micrometers to about 8 micrometers). In some embodiments, the target 102 comprises Ti, the target 102 is a radio frequency (RF) Ti target, a grain size of the target 102 is between about 5 micrometers to about 25 micrometers (such as between about 11 micrometers to about 19 micrometers), the second surface roughness is between about 0.1 micrometers to about 0.5 micrometers (such as between about 0.13 micrometers to about 0.41 micrometers), and/or the third surface roughness is between about 0.1 micrometers to about 0.5 micrometers (such as between about 0.13 micrometers to about 0.41 micrometers). In some embodiments, the target 102 comprises Ta, the target 102 is a G12 Ta target, a grain size of the target 102 is at most about 100 micrometers (such as at most about 70 micrometers), and/or the first surface roughness is between about 2 micrometers to about 10 micrometers (such as between about 5 micrometers to about 8 micrometers). In some embodiments, the target 102 comprises Ta, the target 102 is a BS Ta target, a grain size of the target 102 is between about 30 micrometers to about 150 micrometers (such as between about 57 micrometers to about 120 micrometers), the first surface roughness is between about 10 micrometers to about 30 micrometers (such as between about 12 micrometers to about 23 micrometers), the second surface roughness is at most about 1 micrometer (such as at most about 0.4 micrometers), and/or the third surface roughness is at most about 1 micrometer (such as at most about 0.4 micrometers). In some embodiments, the target 102 comprises Cu, a grain size of the target 102 is between about 10 micrometers to about 80 micrometers (such as between about 30 micrometers to about 50 micrometers), the second surface roughness is at most about 3 micrometers (such as at most about 1.6 micrometers), and/or the third surface roughness is at most about 3 micrometers (such as at most about 1.6 micrometers). In some embodiments, the target 102 comprises CuMn and/or a grain size of the target 102 is at most about 2 micrometers (such as at most about 1 micrometer). In some embodiments, the target 102 comprises Co and/or a grain size of the target 102 is at most about 2 micrometers (such as at most about 0.8 micrometers).

The first portion 110 of the edge 108 of the target 102 is processed to achieve the first surface roughness. The first portion 110 of the edge 108 of the target 102 is processed to achieve the first surface roughness using at least one processing method comprising at least one of abrasive blasting (such as "sandblasting") the first portion 110 of the edge 108 of the target 102, shot peening the first portion 110 of the edge 108 of the target 102 (such as using shot and/or melt shot), knurling the first portion 110 of the edge 108 of the target 102, or other suitable processing method. The first portion 110 of the edge 108 of the target 102 has a pattern of at least one of straight horizontal lines, angled lines, crossed lines, etc. Other methods for achieving the first surface roughness and/or other structures and/or configurations of the edge 108 of the target 102 are within the scope of the present disclosure.

The PVD system 100 comprises a first power generator 144 electrically coupled to the PVD chamber 150, such as to the backplane structure 120 or other portion of the PVD chamber 150. The first power generator 144 is configured to generate a power, such as at least one of a RF power or a direct current (DC) power. The PVD system 100 comprises one or more magnets 146. In some embodiments, the PVD system 100 comprises a second power generator (not shown) electrically coupled to the PVD chamber 150, such as to the wafer support 128 or other portion of the PVD chamber 150. The second power generator is configured to generate a bias power. The first gas 140 enters the PVD volume 116. The PVD system 100 is configured to establish a plasma (such as a plasma 710 shown in FIG. 7) in the PVD volume 116 from the first gas 140. The plasma is used for depositing the target material of the target 102 onto the wafer 118, such as to form the thin film on the surface 119 of the wafer 118. The target material (such as atoms and/or molecules of the target 102) is dislodged from the target 102 and converted into vapor by the plasma (such as by means of gaseous ions of the plasma bombarding and/or impinging upon the target 102). The vapor undergoes condensation on the wafer 118, such as to form the thin film on the surface 119 of the wafer 118. The PVD system 100 establishes the plasma using at least one of the first power generator 144, the second power generator, the one or more magnets 146, or one or more other suitable components of the PVD system 100. At least one of the first power generator 144, the second power generator, or the one or more magnets 146 are controlled to at least one of control an ion bombardment force in the PVD volume 116 or to obtain one or more desired properties of the thin film formed on the surface 119 of the wafer 118. Interactions among the first power generator 144, the second power generator, the one or more magnets 146, and/or the wafer support 128 are within the scope of the present disclosure.

Particles in the PVD chamber 150 adhere to the first portion 110 of the edge 108 of the target 102 and/or accumulate on the first portion 110 of the edge 108 of the target 102, such as during the PVD process. A first amount of particles accumulated on the first portion 110 of the edge 108 of the target 102 is greater than a second amount of particles accumulated on the second portion 112 of the edge 108 of the target 102, such as at least due to the first surface roughness being higher than the second surface roughness. Accordingly, the first portion 110 of the edge 108 of the target 102 having the first roughness inhibits accumulation of contaminants (such as the particles) on the wafer 118 at least due to contaminants, that would otherwise accumulate on the wafer 118 if the first portion 110 of the edge 108 of the target 102 did not have a surface roughness higher than the second surface roughness, adhering to the first portion 110 of the edge 108 of the target 102.

A service lifetime of the target 102 is finite. The service lifetime of the target 102 can be measured and/or expressed in units of accumulated energy, such as kilowatt-hours, consumed by at least one of the PVD system 100 or the PVD chamber 150. An end point of the service lifetime of the target 102 is between about 1,000 killowatt-hours to about 3,000 killowatt-hours (such as about 2,000 killowatt-hours). Other values of the end point of the service lifetime of the target 102 are within the scope of the present disclosure. The target 102 can be replaced after the end point of the service lifetime of the target 102 is reached, such as to avoid overuse of the target 102 which can result in at least one of perforation of the target 102, production losses, damage to one or more components of the PVD system 100, safety problems, etc. As the service lifetime of the target 102 progresses and the target 102 is used by the PVD system 100, a target size (such as a target thickness) of the target 102 decreases (such as due to the PVD system 100 and depositing target material from the target 102 onto one or more wafers such as the wafer 118).

In some embodiments, the first distance 114 of the extension of the first portion 110 of the edge 108 of the target 102 is at least a minimum distance. The minimum distance is between about 2 millimeters to about 6 millimeters (such as between about 2 millimeters to about 5.5 millimeters, such as between about 2 millimeters to about 4 millimeters, such as between about 4 millimeters to about 6 millimeters, or such as about 4 millimeters). By providing for the first distance 114 of the extension of the first portion 110 of the edge 108 of the target 102 to be at least the minimum distance, the first portion 110 of the edge 108 of the target 102 inhibits accumulation of contaminants on one or more wafers during PVD process performed throughout the service lifetime of the target 102, at least due to contaminants, that would otherwise accumulate on a wafer if the first distance 114 was less than the minimum distance, adhering to the first portion 110 of the edge 108 of the target 102.

In some embodiments, the first distance 114 of the extension of the first portion 110 of the target 102 is at most a maximum distance. The maximum distance is between about 4 millimeters to about 6 millimeters (such as between about 4 millimeters to about 5.5 millimeters, such as between about 5 millimeters to about 6 millimeters, or such as about 6 millimeters). Limiting the extension of the first portion 110 of the edge 108 of the target 102 (from the first surface 104 of the target to the second portion 112 of the edge 108 of the target 102) to be at most the maximum distance provides for a reduction in an amount of contaminants accumulating on a wafer during one or more PVD processes. The target size of the target 102 decreases to a first threshold target size, such as when a first point of the service lifetime of the target 102 is reached. The first point of the service lifetime of the target 102 is between about 1,100 killowatt-hours to about 1,800 killowatt-hours (such as about 1,400 killowatt-hours). Other values of the first point of the service lifetime of the target 102 are within the scope of the present disclosure. In some PVD systems, a rough portion of an edge of a target (such as the first portion 110 of the edge 108 of the target 102) extends a second distance from a top surface of the target to a non-rough portion of the edge of the target. The second distance is larger than the maximum distance. In those PVD systems, after the first point of a service lifetime of the target is reached and/or a target size of the target decreases to the first threshold target size, contaminants, that previously adhered to the rough portion of the edge of the target during one or more previous PVD processes, become dislodged from the target during subsequent PVD processes performed after the first point of the service lifetime of the target is reached and/or the target size of the target reaches the first threshold target size, such as due to the rough portion of the edge becoming more exposed to gas and/or plasma as the target size of the target decreases. At least some of the dislodged contaminants accumulate on one or more wafers.

In some embodiments, at least some of the edge 108 of the target 102 that becomes more exposed to the first gas 140 and/or the plasma when at least one of the first point of the service lifetime of the target 102 is reached or the target size of the target 102 reaches the first threshold target size does not include the first portion 110 of the edge 108 of the target 102 due to limiting the extension of the first portion 110 of the edge 108 of the target to be at most the maximum distance. In some embodiments, the first portion 110 is less exposed to the first gas 140 and/or the plasma when at least one of the first point of the service lifetime of the target 102 is reached or the target size of the target 102 reaches the first threshold target size, as compared to other PVD systems where the extension of the first portion 110 of the edge 108 of the target 102 (from the first surface 104 of the target to the second portion 112 of the edge 108 of the target 102) is larger than the maximum distance. The reduced exposure of the first portion 110 of the edge 108 of the target 102 to the first gas 140 and/or the plasma provides for a reduction in an amount of contaminants that are dislodged from the edge 108 of the target 102 during a PVD process performed after at least one of the first point of the service lifetime of the target 102 is reached or the target size of the target 102 reaches the first threshold target size. The reduction in the amount of contaminants that are dislodged from the edge 108 of the target 102 provides for a reduction in an amount of contaminants accumulating on a wafer during the PVD process performed after at least one of the first point of the service lifetime of the target 102 is reached or the target size of the target 102 reaches the first threshold target size. Given the reduction in the amount of contaminants accumulating on the wafer, the PVD system 100 operates more efficiently than other PVD systems, such as requiring less cleaning and/or maintenance of the PVD chamber 150, yielding fewer wafer defects in wafers, etc.

Limiting the extension of the first portion 110 of the edge 108 of the target 102 (from the first surface 104 of the target to the second portion 112 of the edge 108 of the target 102) to be at most the maximum distance provides for a reduction in an amount of arcing that occurs in the PVD system 100. The target size of the target 102 decreases to a second threshold target size, such as when a second point of the service lifetime of the target 102 is reached. The second point of the service lifetime of the target 102 is between about 1,100 killowatt-hours to about 1,800 killowatt-hours (such as about 1,400 killowatt-hours). Other values of the second point of the service lifetime of the target 102 are within the scope of the present disclosure. In some PVD systems where a rough portion of an edge of a target (such as the first portion 110 of the edge 108 of the target 102) extends the second distance from a top surface of the target to a non-rough portion of the edge of the target, when the second point of a service lifetime of the target is reached and/or a target size of the target decreases to the second threshold target size, arcing occurs. The arcing is at least due to the rough portion of the target becoming more exposed to plasma as the target size of the target decreases which can cause an increased amount of interactions among plasma and electrical intensity at rough edges and/or spikes in the rough portion of the target, where the electrical intensity at the rough edges and/or spikes in the rough portion of the target is higher than an electrical intensity at the non-rough portion of the target.

In some embodiments, the first portion 110 is less exposed to the plasma when at least one of the second point of the service lifetime of the target 102 is reached or the target size of the target 102 reaches the second threshold target size, as compared to other PVD systems where the extension of the first portion 110 of the edge 108 of the target 102 (from the first surface 104 of the target to the second portion 112 of the edge 108 of the target 102) is larger than the maximum distance. The reduced exposure of the first portion 110 of the edge 108 of the target 102 to the plasma provides for a reduction in an amount of arcing that occurs in PVD processes performed after at least one of the second point of the service lifetime of the target 102 is reached or the target size of the target 102 reaches the second threshold target size, as compared to other systems where the extension of the first portion 110 of the edge 108 of the target 102 (from the first surface 104 of the target to the second portion 112 of the edge 108 of the target 102) is larger than the maximum distance. Given the reduction in the amount of arcing, the PVD system 100 operates more efficiently than other PVD systems, such as inhibiting damage to one or more components of the PVD system 100, requiring less maintenance of the PVD system 100, etc.

Figure 3A:
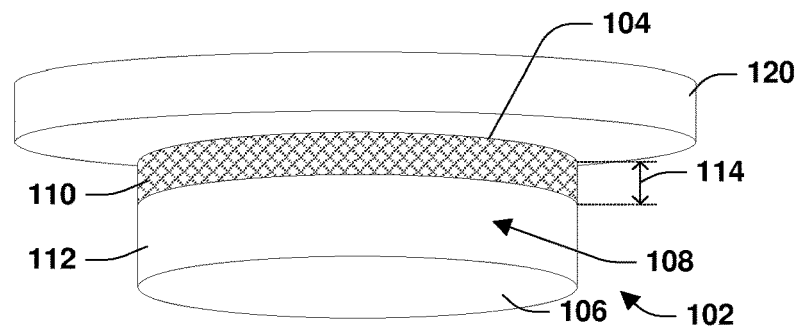
FIGS. 3A-3B illustrate perspective views of at least some of a PVD system, in accordance with some embodiments.
Figure 3B:
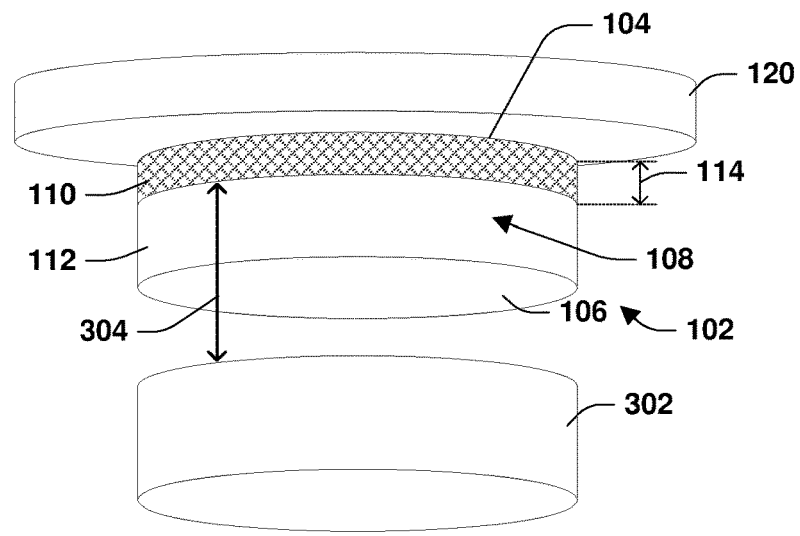

FIGS. 3A-3B illustrate perspective views of the PVD system 100 according to some embodiments. FIG. 3A illustrates the backplane structure 120 overlying the target 102, according to some embodiments. In some embodiments, such as shown in FIG. 3A and FIG. 3B, a distance at which the first portion 110 of the edge 108 of the target 102 extends from the first surface 104 of the target 102 to the second portion 112 of the edge 108 of the target 102 around the edge 108 of the target 102 remains constant or is about equal to the first distance 114 or smaller than the first distance 114.

FIG. 3B illustrates the backplane structure 120, the target 102, and a chamber structure 302 of the PVD chamber 150, according to some embodiments. The chamber structure 302 corresponds to at least some of the PVD chamber 150, such as at least one of the inner chamber wall 122, the chamber wall 134, or other portion of the PVD chamber 150. A distance 304 between the chamber structure 302 and the first portion 110 of the edge 108 of the target 102 is at least a first threshold distance. In some embodiments, the first portion 110 of the edge 108 of the target 102 is designed and/or the target 102 is processed (such as using the one or more processing methods) based upon a structural configuration and/or a position of the chamber structure 302 such that the distance 304 between the chamber structure 302 and the first portion 110 of the edge 108 of the target 102 is at least the first threshold distance.

Figure 4A:
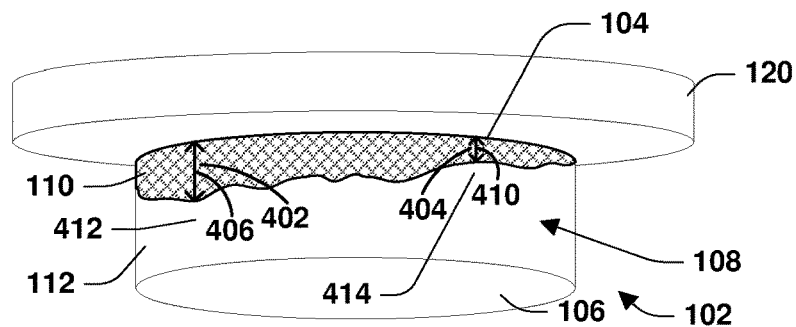
FIGS. 4A-4B illustrate perspective views of at least some of a PVD system, in accordance with some embodiments.
Figure 4B:
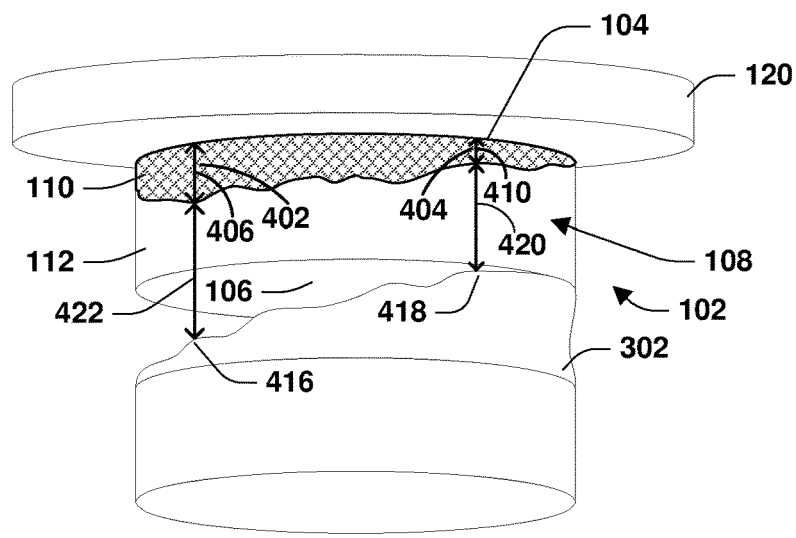

FIGS. 4A-4B illustrate perspective views of the PVD system 100 according to some embodiments. FIG. 4A illustrates the backplane structure 120 overlying the target 102, according to some embodiments. A first area 402 of the first portion 110 of the edge 108 of the target 102 overlies and extends towards a first area 412 of the second portion 112 of the edge 108 of the target 102. A second area 404 of the first portion 110 of the edge 108 of the target 102 overlies and extends towards a second area 414 of the second portion 112 of the edge 108 of the target 102.

The first area 402 of the first portion 110 of the edge 108 of the target 102 has a first size and the second area 404 of the first portion 110 of the edge 108 of the target 102 has a second size. The first size is different than the second size. In some embodiments, the first size corresponds to a first height 406 of the first area 402 of the first portion 110 of the edge 108 of the target 102. The first height 406 corresponds to a distance at which the first area 402 of the first portion 110 of the edge 108 of the target 102 extends from the first surface 104 of the target 102 to the first area 412 of the second portion 112 of the edge 108 of the target 102. The first height 406 is at most equal to the maximum distance of the first distance 114. The second size corresponds to a second height 410 of the second area 404 of the first portion 110 of the edge 108 of the target 102. The second height 410 corresponds to a distance at which the second area 404 of the first portion 110 of the edge 108 of the target 102 extends from the first surface 104 of the target 102 to the second area 414 of the second portion 112 of the edge 108 of the target 102. The second height 410 is smaller than the first height 406. The first area 402 of the first portion 110 of the edge 108 of the target 102 has a first shape and the second area 404 of the first portion 110 of the edge 108 of the target 102 has a second shape. In some embodiments, the first shape is different than the second shape.

FIG. 4B illustrates the backplane structure 120, the target 102, and the chamber structure 302 of the PVD chamber 150, according to some embodiments. A distance between the chamber structure 302 and the target 102 changes along a circumference of the chamber structure 302, such as at least due to a height of the chamber structure 302 changing along the circumference of the chamber structure 302. A distance 422 between the first area 402 of the first portion 110 of the edge 108 of the target 102 and a first portion 416 of the chamber structure 302 is at least the first threshold distance. A distance 420 between the second area 404 of the first portion 110 of the edge 108 of the target 102 and a second portion 418 of the chamber structure 302 is at least the first threshold distance. In some embodiments, the first portion 110 of the edge 108 of the target 102 is designed and/or the target 102 is processed (such as using the one or more processing methods) based upon a structural configuration and/or a position of the chamber structure 302 such that distances (such as the distance 422 and/or the distance 420) between areas of the first portion 110 of the edge 108 of the target 102 (such as the first area 402 and/or the second area 404) and portions of the chamber structure 302 (such as the first portion 416 of the chamber structure 302 and/or the second portion 418 of the chamber structure 302) are at least the first threshold distance.

Figure 5A:
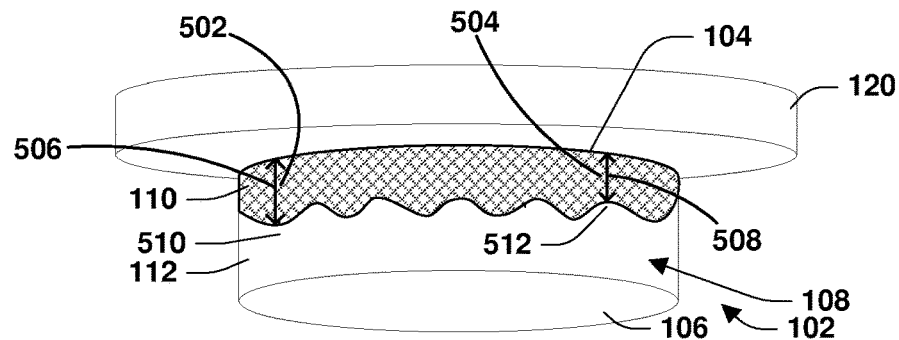
FIGS. 5A-5B illustrate perspective views of at least some of a PVD system, in accordance with some embodiments.
Figure 5B:
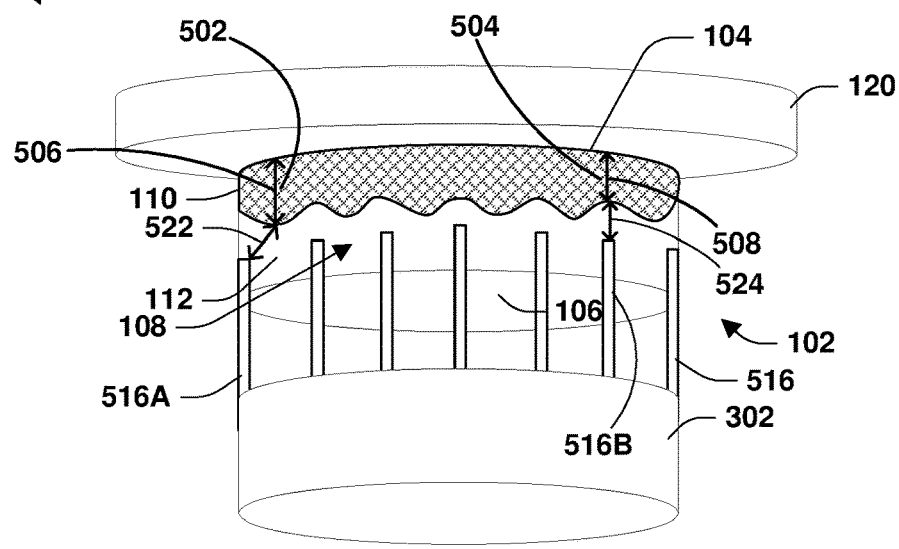

FIGS. 5A-5B illustrate perspective views of the PVD system 100 according to some embodiments. FIG. 5A illustrates the backplane structure 120 overlying the target 102, according to some embodiments. A third area 502 of the first portion 110 of the edge 108 of the target 102 overlies and extends towards a third area 510 of the second portion 112 of the edge 108 of the target 102. A fourth area 504 of the first portion 110 of the edge 108 of the target 102 overlies and extends towards a fourth area 512 of the second portion 112 of the edge 108 of the target 102.

The third area 502 of the first portion 110 of the edge 108 of the target 102 has a third size and the fourth area 504 of the first portion 110 of the edge 108 of the target 102 has a fourth size. The third size is different than the fourth size. In some embodiments, the third size corresponds to a third height 506 of the third area 502 of the first portion 110 of the edge 108 of the target 102. The third height 506 corresponds to a distance at which the third area 502 of the first portion 110 of the edge 108 of the target 102 extends from the first surface 104 of the target 102 to the third area 510 of the second portion 112 of the edge 108 of the target 102. The third height 506 is at most equal to the maximum distance of the first distance 114. The fourth size corresponds to a fourth height 508 of the fourth area 504 of the first portion 110 of the edge 108 of the target 102. The fourth height 508 corresponds to a distance at which the fourth area 504 of the first portion 110 of the edge 108 of the target 102 extends from the first surface 104 of the target 102 to the fourth area 512 of the second portion 112 of the edge 108 of the target 102. The fourth height 508 is smaller than the third height 506. The third area 502 of the first portion 110 of the edge 108 of the target 102 has a third shape and the fourth area 504 of the first portion 110 of the edge 108 of the target 102 has a fourth shape. In some embodiments, the third shape is different than the fourth shape.

FIG. 5B illustrates the backplane structure 120, the target 102, and the chamber structure 302 of the PVD chamber 150, according to some embodiments. In some embodiments, the chamber structure 302 comprises pillars 516, such as positioned along the circumference of the chamber structure 302. A distance 522 between the third area 502 of the first portion 110 of the edge 108 of the target 102 and a first pillar 516A of the pillars 516 is at least the first threshold distance. A distance 524 between the fourth area 504 of the first portion 110 of the edge 108 of the target 102 and a second pillar 516B of the pillars 516 is at least the first threshold distance. In some embodiments, the first portion 110 of the edge 108 of the target 102 is designed and/or the target 102 is processed (such as using the one or more processing methods) based upon a structural configuration and/or a position of the chamber structure 302 and/or the pillars 516 such that distances (such as the distance 522 and/or the distance 524) between areas of the first portion 110 of the edge 108 of the target 102 (such as the third area 502 and/or the fourth area 504) and the pillars 516 of the chamber structure 302 are at least the first threshold distance.

Forming the target 102 such that distances between areas of the first portion 110 of the edge 108 of the target 102 and portions of the chamber structure 302 are at least the first threshold distance, such as described with respect to FIGS. 3A-5B, inhibits arcing from occurring as a result of inhibiting one or more interactions (such as electrical interactions) between the chamber structure 302 and the first portion 110 of the edge 108 of the target 102. Accordingly, by forming the target 102 such that the distances between areas of the first portion 110 of the edge 108 of the target 102 and portions of the chamber structure 302 are at least the first threshold distance provides for a reduction in an amount of arcing that occurs in the PVD system 100, as compared to other systems where a distance between a rough portion of a target and a chamber structure are less than the first threshold distance. Given the reduction in the amount of arcing, the PVD system 100 operates more efficiently than other PVD systems, such as by inhibiting damage to one or more components of the PVD system 100, requiring less maintenance of the PVD chamber 150, etc.

Figure 6:
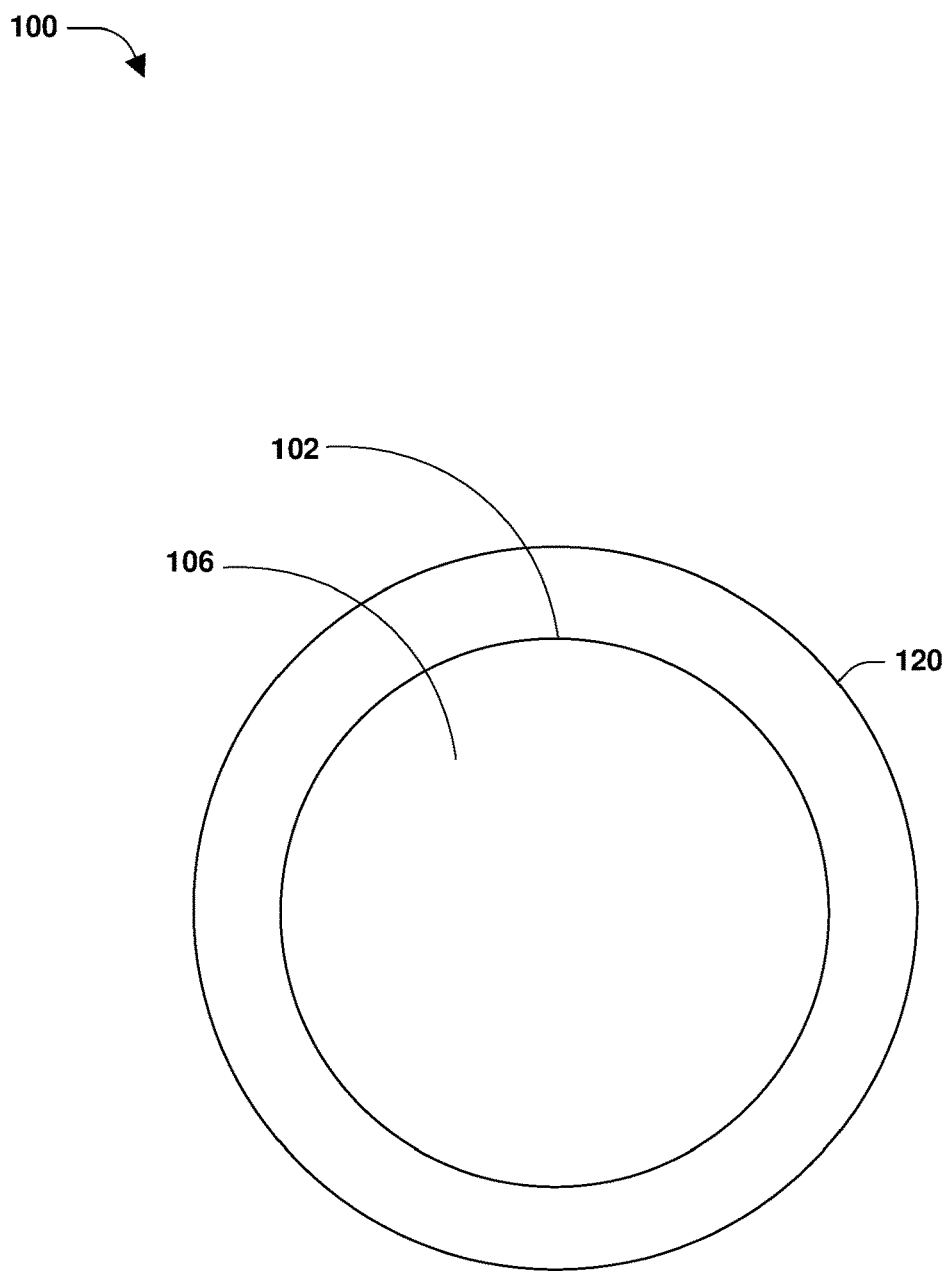
FIG. 6 illustrates a bottom-side view of at least some of a PVD system, in accordance with some embodiments.

FIG. 6 illustrates a bottom-side view of the target 102 underlying the backplane structure 120, according to some embodiments, such as where the edge 108 of the target 102 is not tapered (shown in FIG. 2). In some embodiments, the second surface 106 of the target 102 is exposed.

Figure 7:
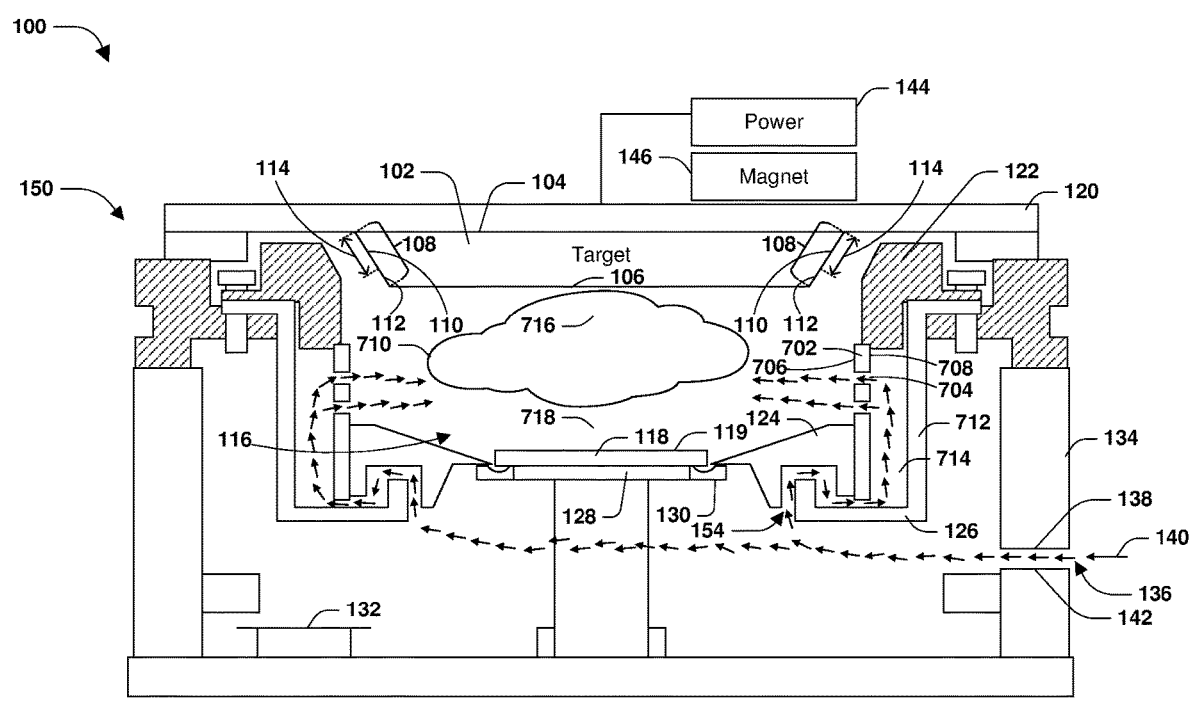
FIG. 7 illustrates a cross-sectional view of at least some of a PVD system, in accordance with some embodiments.

FIG. 7 illustrates a cross-sectional view of the PVD system 100, according to some embodiments. The PVD system 100 comprises a gas conducting structure 702 (such as a gas conduction ring) in the PVD chamber 150 to conduct the first gas 140 into the PVD volume 116. The gas conducting structure 702 is between a wall 712 of the shielding structure 126 and at least one of the wafer 118, the wafer support 128, the deposition structure 130, or the cover structure 124. Openings 704 are defined in the gas conducting structure 702. An opening of the openings 704 can have any shape. A first opening of the openings 704 extends from an inner sidewall 706 of the gas conducting structure 702 to an outer sidewall 708 of the gas conducting structure 702 opposite the inner sidewall 706 of the gas conducting structure 702. The inner sidewall 706 faces the PVD volume 116. The outer sidewall 708 faces the wall 712 of the shielding structure 126. Other structures and/or configurations of the gas conducting structure 702 are within the scope of the present disclosure.

Arrows are shown in FIG. 7 that are representative of flow of the first gas 140 according to some embodiments. The first gas 140 is conducted into a space 714 via the path 154 between the cover structure 124 and the shielding structure 126. The space 714 is defined by at least one of the gas conducting structure 702, the shielding structure 126, the inner chamber wall 122, or other portion of the PVD chamber 150. The space 714 is between the gas conducting structure 702 and the wall 712 of the shielding structure 126. The first gas 140 flows from the space 714, through the openings 704, into the PVD volume 116. Other structures and/or configurations of the gas conducting structure 702, the cover structure 124, and/or the shielding structure 126 are within the scope of the present disclosure.

In some embodiments, the gas conducting structure 702 provides for an increased uniformity of flow and/or distribution of the first gas 140 into the PVD volume 116, as compared to other systems that do not have the gas conducting structure 702 in the PVD chamber 150. Given the increased uniformity of flow and/or distribution of the first gas 140 into the PVD volume 116, the PVD system 100 establishes a plasma 710 from the first gas 140 with a more stable and/or uniform plasma concentration and/or density throughout the PVD volume 116 and/or under the target 102. Given the increased uniformity of flow and/or distribution of the first gas 140 into the PVD volume 116 and/or the more stable and/or uniform plasma concentration and/or density, the PVD system 100 provides for a reduction in an amount of arcing that occurs in the PVD volume 116, as compared to other systems that do not have the gas conducting structure 702.

Other PVD systems do not have the gas conducting structure 702 in a PVD chamber. In those PVD systems, flow and/or distribution of PVD gas (such as the first gas 140) into a PVD volume (such as the PVD volume 116) is non-uniform. In those PVD systems, plasma is established from the PVD gas having an unstable and/or non-uniform plasma concentration and/or plasma density throughout the PVD volume, which can causing arcing in the PVD volume. In those PVD systems, a concentration and/or a density of the PVD gas is higher in lower regions of the PVD volume than in upper regions of the PVD volume, where the lower regions of the PVD volume are further from a target in the PVD chamber than the upper regions. In those PVD systems, a concentration and/or a density of the plasma established from the PVD gas is higher in the lower regions of the PVD volume than in the upper regions of the PVD volume.

The gas conducting structure 702 in the PVD chamber 150 provides for an increased concentration and/or density of the first gas 140 in an upper region 716 of the PVD volume 116, as compared to systems that do not have the gas conducting structure 702. The gas conducting structure 702 in the PVD chamber 150 provides for an increased concentration and/or density of the plasma 710 established in the upper region 716 of the PVD volume 116, as compared to systems that do not have the gas conducting structure 702. The increased concentration and/or density of the first gas 140 and/or the increased concentration and/or density of the plasma 710 in the upper region 716 provides for more efficient operation of the PVD system 100, such as an increased deposition rate during one or more PVD processes, such as due to an increase in a bombardment force upon the target 102 by the plasma 710. In some embodiments, the concentration and/or density of the first gas 140 in the upper region 716 of the PVD volume 116 is at least one of higher than or about equal to a concentration and/or a density of the first gas 140 in a lower region 718 of the PVD volume 116, where the lower region 718 is further from the target 102 than the upper region 716. In some embodiments, the concentration and/or density of the plasma 710 in the upper region 716 of the PVD volume 116 is at least one of higher than or about equal to a concentration and/or a density of the plasma 710 in the lower region 718 of the PVD volume 116.

Figure 8:
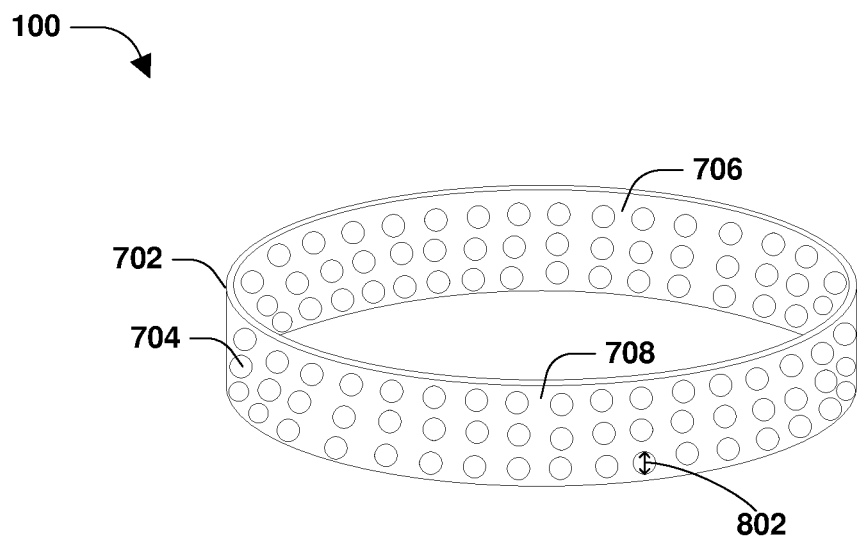
FIGS. 8-18 illustrate perspective views of at least some of a PVD system, in accordance with some embodiments.

FIG. 8 illustrates a perspective view of at least some of the gas conducting structure 702, according to some embodiments. The gas conducting structure 702 is at least one of a hollow cylinder, disk, ring, or other suitable structure. The openings 704 are defined within and penetrate through the gas conducting structure 702. In some embodiments, such as shown in FIG. 8, a cross-sectional shape of an opening of the openings 704 is circular. A diameter 802 of an opening of the openings 704 is between about 0.1 millimeters to about 5 millimeters (such as between about 1 millimeter to about 2 millimeters).

Figure 9:
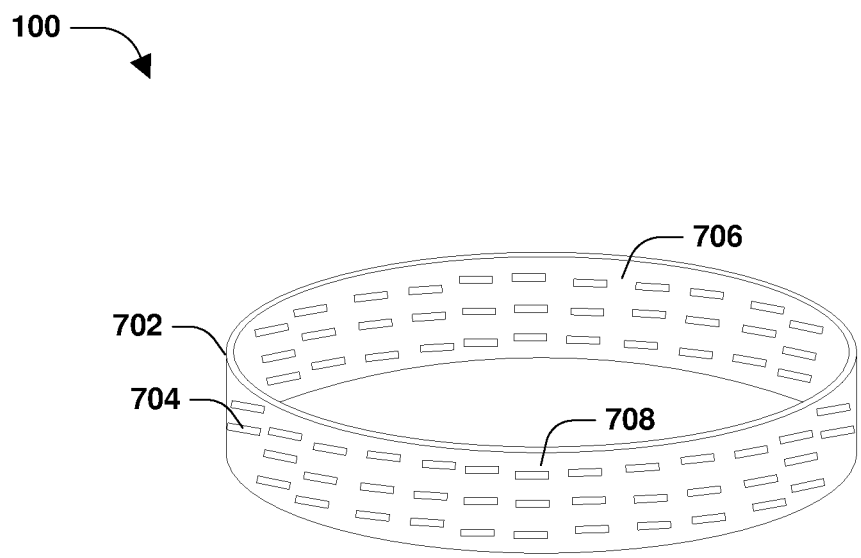

FIG. 9 illustrates a perspective view of at least some of the gas conducting structure 702, according to some embodiments. In some embodiments, such as shown in FIG. 9, a cross-sectional shape of an opening of the openings 704 is rectangular.

Figure 10:
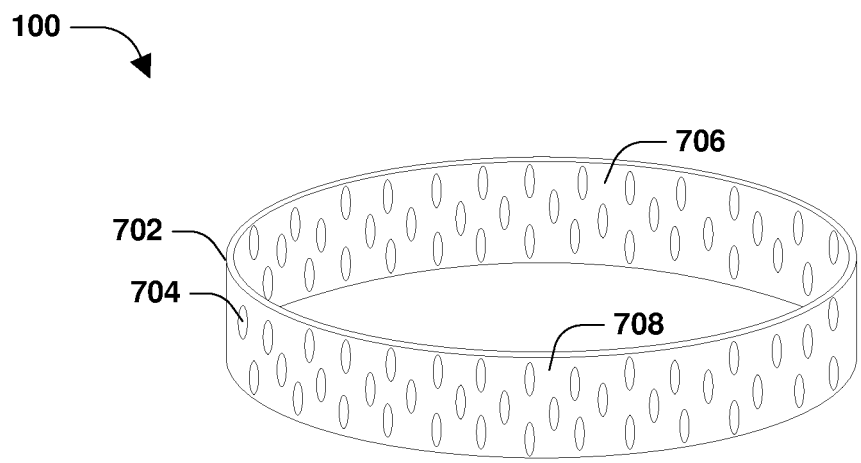

FIG. 10 illustrates a perspective view of at least some of the gas conducting structure 702, according to some embodiments. In some embodiments, such as shown in FIG. 10, a cross-sectional shape of an opening of the openings 704 is elliptical.

Figure 11:
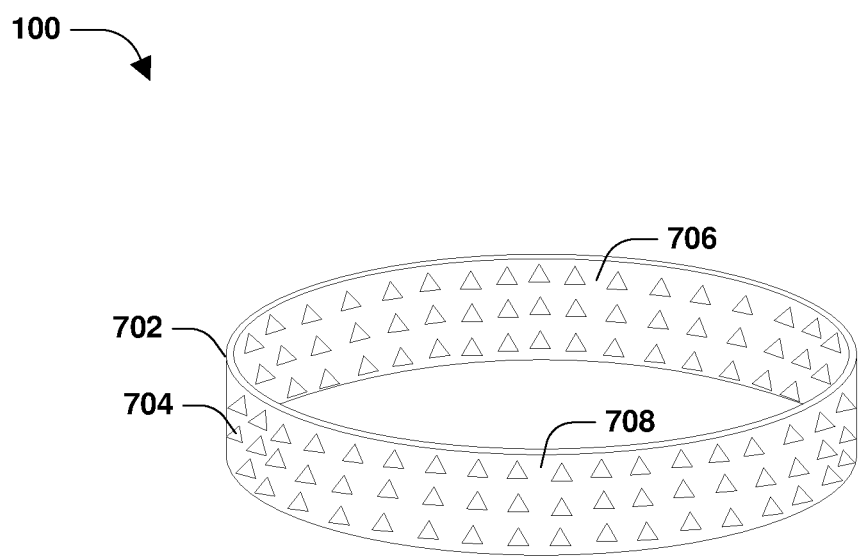

FIG. 11 illustrates a perspective view of at least some of the gas conducting structure 702, according to some embodiments. In some embodiments, such as shown in FIG. 11, a cross-sectional shape of an opening of the openings 704 is triangular.

In some embodiments, such as illustrated in FIGS. 8-11, shapes of the openings 704 are similar to each other and/or sizes of the openings 704 are similar to each other. According to some embodiments, such as illustrated in FIGS. 8-11, the openings 704 are distributed uniformly throughout at least some of the gas conducting structure 702. Shapes and/or configurations of the openings 704 other than those shown in FIGS. 8-11 are within the scope of the present disclosure.

In some embodiments, at least one of a number, size, shape, distribution, or other characteristics of the openings 704 defined within and penetrating through the gas conducting structure 702 vary among the openings 704 depending upon various factors. Accordingly, instant application, including the scope of the appended claims, is not limited to the examples provided herein.

In some embodiments, a first shape of a first opening of the openings 704 differs from a second shape of a second opening of the openings 704. In some embodiments, a first size (such as a first dimension, a first cross-sectional area and/or a first volume) of a first opening of the openings 704 differs from a second size (such as a second dimension, a second cross-sectional area and/or a second volume) of a second opening of the openings 704. In some embodiments, a first shape of a first opening of the openings 704 differs from a second shape of a second opening of the openings 704, but a first size (such as a first dimension, a first cross-sectional area and/or a first volume) of the first opening is similar to a second size (such as a second dimension, a second cross-sectional area and/or a second volume) of the second opening. In some embodiments, a first size (such as a first dimension, a first cross-sectional area and/or a first volume) of a first opening of the openings 704 differs from a second size (such as a second dimension, a second cross-sectional area and/or a second volume) of a second opening of the openings 704, but a first shape of the first opening is similar to a second shape of the second opening. In some embodiments, a first opening of the openings 704 has a conical shape and a second opening of the openings 704 has the conical shape but the first conical shape is larger than the second conical shape. In some embodiments, a first opening of the openings 704 has a cylindrical shape and a second opening of the openings 704 has the cylindrical shape but the first cylindrical shape is larger than the second cylindrical shape. In some embodiments, the openings 704 are distributed non-uniformly throughout the gas conducting structure 702. A first opening of the openings 704 is separated from a second opening of the openings 704 by a first distance. The second opening of the openings 704 is separated from a third opening of the openings 704 by a second distance. In some embodiments, the second distance is different than the first distance.

Figure 12:
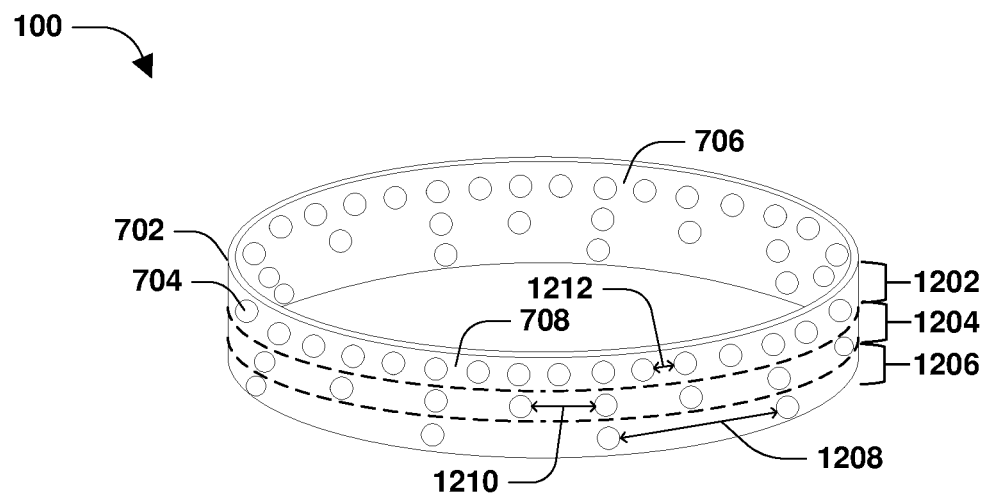

FIG. 12 illustrates a perspective view of at least some of the gas conducting structure 702, according to some embodiments. The gas conducting structure 702 defines a first plurality of groups of openings 704. Any number of groups of the first plurality of groups of openings 704 is contemplated, where respective groups have any number of openings 704 that are the same or different from group to group. The first plurality of groups of openings 704 comprises at least one of a first group 1202 of openings 704, a second group 1204 of openings 704 under the first group 1202, a third group 1206 of openings 704 under the second group 1204, or one or more other groups of openings 704. The first group 1202 is nearer the target 102 than the second group 1204 is to the target 102. The second group 1204 is nearer the target 102 than the third group 1206 is to the target 102. The first group 1202 has a greater density of openings 704 than the second group 1204. The second group 1204 has a greater density of openings 704 than the third group 1206. A distance 1212 between two adjacent openings 704 of the first group 1202 is less than a distance 1210 between two adjacent openings 704 of the second group 1204. The distance 1210 between two adjacent openings 704 of the second group 1204 is less than a distance 1208 between two adjacent openings 704 of the third group 1206. The first group 1202 has any number of openings 704, such as one or more openings. The second group 1204 has any number of openings 704, such as one or more openings. The third group 1206 has any number of openings 704, such as one or more openings. In some embodiments, substantially uniform flow and/or distribution of the first gas 140 into the PVD volume 116 occurs among the first plurality of groups of openings 704. In some embodiments, flow of the first gas 140 into the PVD volume 116 is greater among one or more upper groups of the first plurality of groups of openings 704 (such as the first group 1202) than among one or more lower groups of the first plurality of groups of openings 704 (such as the third group 1206). Other configurations of the first plurality of groups of openings 704 are within the scope of the present disclosure.

Figure 13:
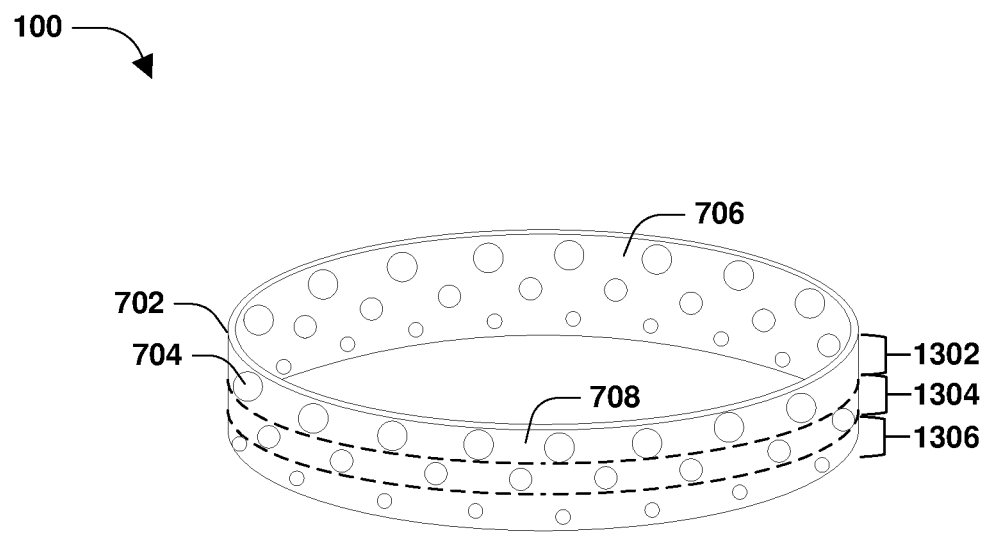

FIG. 13 illustrates a perspective view of at least some of the gas conducting structure 702, according to some embodiments. The gas conducting structure 702 defines a second plurality of groups of openings 704. Any number of groups of the second plurality of groups of openings 704 is contemplated, where respective groups have any number of openings 704 that are the same or different from group to group. The second plurality of groups of openings 704 comprises at least one of a first group 1302 of openings 704, a second group 1304 of openings 704 under the first group 1302, a third group 1306 of openings 704 under the second group 1304, or one or more other groups of openings 704. The first group 1302 is nearer the target 102 than the second group 1304 is to the target 102. The second group 1304 is nearer the target 102 than the third group 1306 is to the target 102. Openings 704 in the first group 1302 are larger than openings 704 in the second group 1304. Openings 704 in the second group 1304 are larger than openings 704 in the third group 1306. In some embodiments, the first group 1302, the second group 1304, and the third group 1306 have a different density or number of openings 704 relative to each other. The first group 1302 has any number of openings 704, such as one or more openings. The second group 1304 has any number of openings 704, such as one or more openings. The third group 1306 has any number of openings 704, such as one or more openings. In some embodiments, substantially uniform flow and/or distribution of the first gas 140 into the PVD volume 116 occurs among the second plurality of groups of openings 704. In some embodiments, flow of the first gas 140 into the PVD volume 116 is greater among one or more upper groups of the second plurality of groups of openings 704 (such as the first group 1302) than among one or more lower groups of the second plurality of groups of openings 704 (such as the third group 1306). Other configurations of the second plurality of groups of openings 704 are within the scope of the present disclosure.

Figure 14:
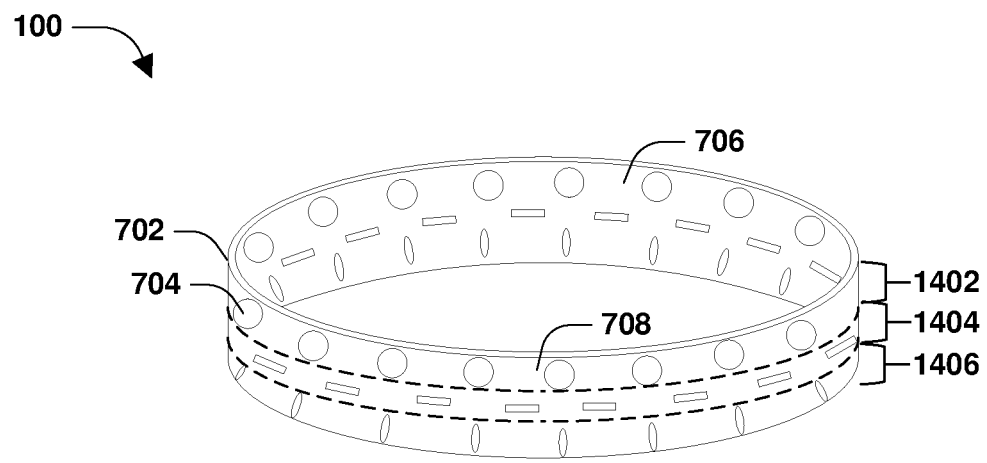

FIG. 14 illustrates a perspective view of at least some of the gas conducting structure 702, according to some embodiments. The gas conducting structure 702 defines a third plurality of groups of openings 704. Any number of groups of the third plurality of groups of openings 704 is contemplated, where respective groups have any number of openings 704 that are the same or different from group to group. The third plurality of groups of openings 704 comprises at least one of a first group 1402 of openings 704, a second group 1404 of openings 704 under the first group 1402, a third group 1406 of openings 704 under the second group 1404, or one or more other groups of openings 704. The first group 1402 is nearer the target 102 than the second group 1404 is to the target 102. The second group 1404 is nearer the target 102 than the third group 1406 is to the target 102. Openings 704 in the first group 1402, openings 704 in the second group 1404, and openings 704 in the third group 1406 have different shapes relative to each other. One or more first shapes of openings 704 in the first group 1402 comprise at least one of a circular cross-sectional shape or other suitable shape. One or more second shapes of openings 704 in the second group 1404 comprise at least one of a rectangular cross-sectional shape or other suitable shape. One or more third shapes of openings 704 in the third group 1406 comprise at least one of an elliptical cross-sectional shape or other suitable shape. In some embodiments, the first group 1402, the second group 1404, and the third group 1406 have a different density or number of openings 704 relative to each other. The first group 1402 has any number of openings 704, such as one or more openings. The second group 1404 has any number of openings 704, such as one or more openings. The third group 1406 has any number of openings 704, such as one or more openings. In some embodiments, substantially uniform flow and/or distribution of the first gas 140 into the PVD volume 116 occurs among the third plurality of groups of openings 704. In some embodiments, flow of the first gas 140 into the PVD volume 116 is greater among one or more upper groups of the third plurality of groups of openings 704 (such as the first group 1402) than among one or more lower groups of the third plurality of groups of openings 704 (such as the third group 1406). Other configurations of the third plurality of groups of openings 704 are within the scope of the present disclosure.

Figure 15:
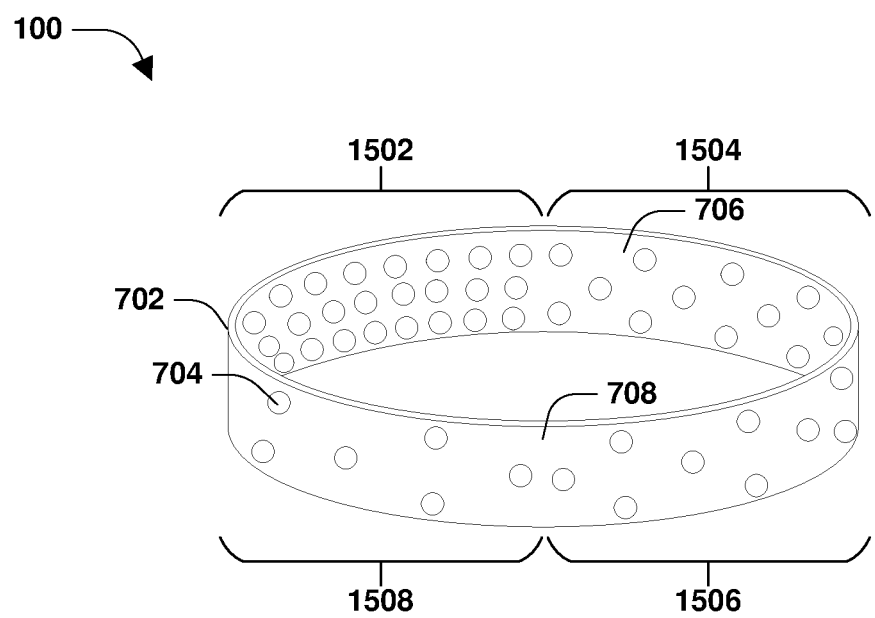

FIG. 15 illustrates a perspective view of at least some of the gas conducting structure 702, according to some embodiments. The gas conducting structure 702 defines a fourth plurality of groups of openings 704. Any number of groups of the fourth plurality of groups of openings 704 is contemplated, where respective groups have any number of openings 704 that are the same or different from group to group. The fourth plurality of groups of openings 704 comprises at least one of a first group 1502 of openings 704, a second group 1504 of openings 704, a third group 1506 of openings 704, a fourth group 1508 of openings 704, or one or more other groups of openings 704. The first group 1502 comprises openings 704 defined in a first portion of the gas conducting structure 702 extending along a proportion of a circumference of the gas conducting structure 702. The second group 1504 comprises openings 704 defined in a second portion of the gas conducting structure 702 extending along a proportion of the circumference of the gas conducting structure 702, where the second portion of the gas conducting structure 702 is adjacent the first portion of the gas conducting structure 702. The third group 1506 comprises openings 704 defined in a third portion of the gas conducting structure 702 extending along a proportion of the circumference of the gas conducting structure 702, where the third portion of the gas conducting structure 702 is adjacent the second portion of the gas conducting structure 702. The fourth group 1508 comprises openings 704 defined in a fourth portion of the gas conducting structure 702 extending along a proportion of the circumference of the gas conducting structure 702, where the fourth portion of the gas conducting structure 702 is adjacent the third portion of the gas conducting structure 702. The first group 1502 has a greater density of openings 704 than the second group 1504. The second group 1504 has a greater density of openings 704 than the third group 1506. The third group 1506 has a greater density of openings 704 than the fourth group 1508.

The first group 1502 has any number of openings 704, such as one or more openings. The second group 1504 has any number of openings 704, such as one or more openings. The third group 1506 has any number of openings 704, such as one or more openings. The fourth group 1508 has any number of openings 704, such as one or more openings. In some embodiments, substantially uniform flow and/or distribution of the first gas 140 into the PVD volume 116 occurs among the fourth plurality of groups of openings 704. In some embodiments, flow of the first gas 140 into the PVD volume 116 is greater among openings 704 in one or more upper regions of the gas conducting structure 702 than among openings 704 in one or more lower regions of the gas conducting structure 702. Other configurations of the fourth plurality of groups of openings 704 are within the scope of the present disclosure.

Figure 16:
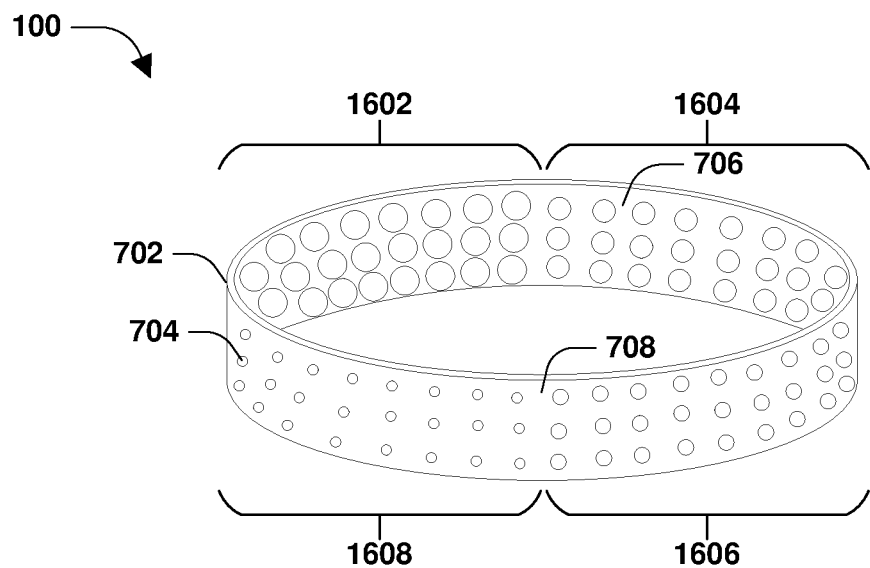

FIG. 16 illustrates a perspective view of at least some of the gas conducting structure 702, according to some embodiments. The gas conducting structure 702 defines a fifth plurality of groups of openings 704. Any number of groups of the fifth plurality of groups of openings 704 is contemplated, where respective groups have any number of openings 704 that are the same or different from group to group. The fifth plurality of groups of openings 704 comprises at least one of a first group 1602 of openings 704, a second group 1604 of openings 704, a third group 1606 of openings 704, a fourth group 1608 of openings 704, or one or more other groups of openings 704. The first group 1602 comprises openings 704 defined in a first portion of the gas conducting structure 702 extending along a proportion of a circumference of the gas conducting structure 702. The second group 1604 comprises openings 704 defined in a second portion of the gas conducting structure 702 extending along a proportion of the circumference of the gas conducting structure 702, where the second portion of the gas conducting structure 702 is adjacent the first portion of the gas conducting structure 702. The third group 1606 comprises openings 704 defined in a third portion of the gas conducting structure 702 extending along a proportion of the circumference of the gas conducting structure 702, where the third portion of the gas conducting structure 702 is adjacent the second portion of the gas conducting structure 702. The fourth group 1608 comprises openings 704 defined in a fourth portion of the gas conducting structure 702 extending along a proportion of the circumference of the gas conducting structure 702, where the fourth portion of the gas conducting structure 702 is adjacent the third portion of the gas conducting structure 702. Openings 704 in the first group 1602 are larger than openings 704 in the second group 1604. Openings 704 in the second group 1604 are larger than openings 704 in the third group 1606. Openings 704 in the third group 1606 are larger than openings 704 in the fourth group 1608. In some embodiments, the first group 1602, the second group 1604, the third group 1606, and the fourth group 1608 have a different density or number of openings 704 relative to each other. The first group 1602 has any number of openings 704, such as one or more openings. The second group 1604 has any number of openings 704, such as one or more openings. The third group 1606 has any number of openings 704, such as one or more openings. The fourth group 1608 has any number of openings 704, such as one or more openings. In some embodiments, substantially uniform flow and/or distribution of the first gas 140 into the PVD volume 116 occurs among the fifth plurality of groups of openings 704. In some embodiments, flow of the first gas 140 into the PVD volume 116 is greater among openings 704 in one or more upper regions of the gas conducting structure 702 than among openings 704 in one or more lower regions of the gas conducting structure 702. Other configurations of the fifth plurality of groups of openings 704 are within the scope of the present disclosure.

Figure 17:
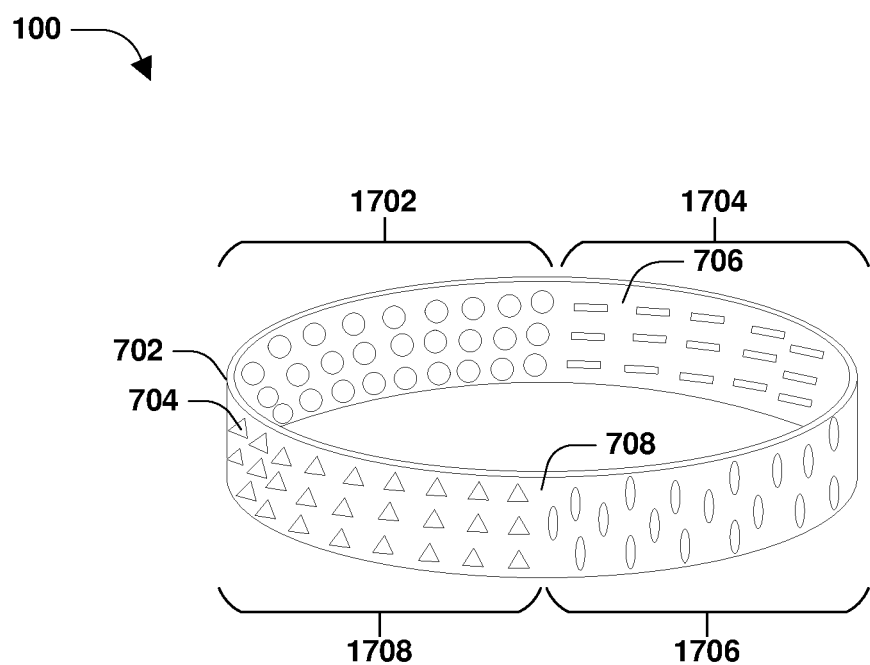

FIG. 17 illustrates a perspective view of at least some of the gas conducting structure 702, according to some embodiments. The gas conducting structure 702 defines a sixth plurality of groups of openings 704. Any number of groups of the sixth plurality of groups of openings 704 is contemplated, where respective groups have any number of openings 704 that are the same or different from group to group. The sixth plurality of groups of openings 704 comprises at least one of a first group 1702 of openings 704, a second group 1704 of openings 704, a third group 1706 of openings 704, a fourth group 1708 of openings 704, or one or more other groups of openings 704. The first group 1702 comprises openings 704 defined in a first portion of the gas conducting structure 702 extending along a proportion of a circumference of the gas conducting structure 702. The second group 1704 comprises openings 704 defined in a second portion of the gas conducting structure 702 extending along a proportion of the circumference of the gas conducting structure 702, where the second portion of the gas conducting structure 702 is adjacent the first portion of the gas conducting structure 702. The third group 1706 comprises openings 704 defined in a third portion of the gas conducting structure 702 extending along a proportion of the circumference of the gas conducting structure 702, where the third portion of the gas conducting structure 702 is adjacent the second portion of the gas conducting structure 702. The fourth group 1708 comprises openings 704 defined in a fourth portion of the gas conducting structure 702 extending along a proportion of the circumference of the gas conducting structure 702, where the fourth portion of the gas conducting structure 702 is adjacent the third portion of the gas conducting structure 702. Openings 704 in the first group 1702, openings 704 in the second group 1704, openings 704 in the third group 1706, and openings 704 in the fourth group 1708 have different shapes relative to each other. One or more first shapes of openings 704 in the first group 1702 comprise at least one of a circular cross-sectional shape or other suitable shape. One or more second shapes of openings 704 in the second group 1704 comprise at least one of a rectangular cross-sectional shape or other suitable shape. One or more third shapes of openings 704 in the third group 1706 comprise at least one of an elliptical cross-sectional shape or other suitable shape. One or more fourth shapes of openings 704 in the fourth group 1708 comprise at least one of a triangular cross-sectional shape or other suitable shape. In some embodiments, the first group 1702, the second group 1704, the third group 1706, and the fourth group 1708 have a different density or number of openings 704 relative to each other. The first group 1702 has any number of openings 704, such as one or more openings. The second group 1704 has any number of openings 704, such as one or more openings. The third group 1706 has any number of openings 704, such as one or more openings. The fourth group 1708 has any number of openings 704, such as one or more openings. In some embodiments, substantially uniform flow and/or distribution of the first gas 140 into the PVD volume 116 occurs among the sixth plurality of groups of openings 704. In some embodiments, flow of the first gas 140 into the PVD volume 116 is greater among openings 704 in one or more upper regions of the gas conducting structure 702 than among openings 704 in one or more lower regions of the gas conducting structure 702. Other configurations of the sixth plurality of groups of openings 704 are within the scope of the present disclosure.

Figure 18:
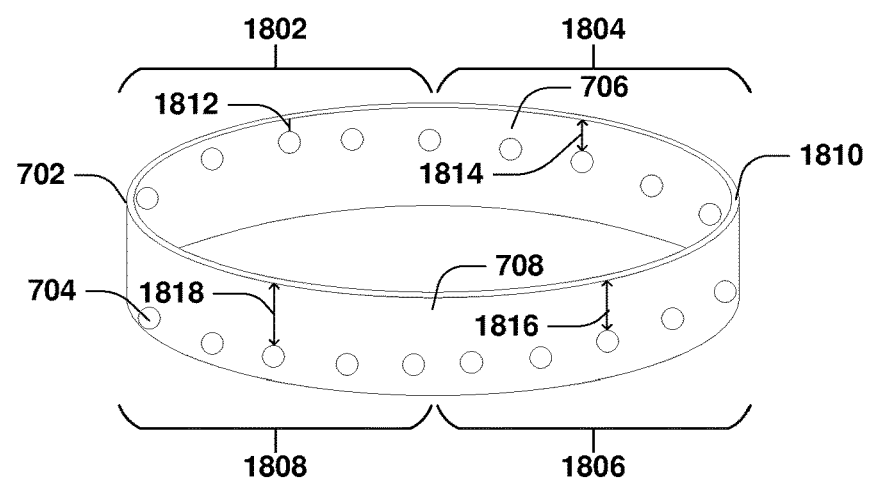

FIG. 18 illustrates a perspective view of at least some of the gas conducting structure 702, according to some embodiments. Openings 704 defined in the gas conducting structure 702 vary in distance from a top surface 1810 of the gas conducting structure 702. The gas conducting structure 702 defines a seventh plurality of groups of openings 704. Any number of groups of the seventh plurality of groups of openings 704 is contemplated, where respective groups have any number of openings 704 that are the same or different from group to group. The seventh plurality of groups of openings 704 comprises at least one of a first group 1802 of openings 704, a second group 1804 of openings 704, a third group 1806 of openings 704, a fourth group 1808 of openings 704, or one or more other groups of openings 704. The first group 1802 comprises openings 704 defined in a first portion of the gas conducting structure 702 extending along a proportion of a circumference of the gas conducting structure 702. The second group 1804 comprises openings 704 defined in a second portion of the gas conducting structure 702 extending along a proportion of the circumference of the gas conducting structure 702, where the second portion of the gas conducting structure 702 is adjacent the first portion of the gas conducting structure 702. The third group 1806 comprises openings 704 defined in a third portion of the gas conducting structure 702 extending along a proportion of the circumference of the gas conducting structure 702, where the third portion of the gas conducting structure 702 is adjacent the second portion of the gas conducting structure 702. The fourth group 1808 comprises openings 704 defined in a fourth portion of the gas conducting structure 702 extending along a proportion of the circumference of the gas conducting structure 702, where the fourth portion of the gas conducting structure 702 is adjacent the third portion of the gas conducting structure 702. Openings 704 of the first group 1802 are nearer the top surface 1810 than openings 704 of the second group 1804 are to the top surface 1810. A distance 1812 between an opening 704 of the first group 1802 and the top surface 1810 is less than a distance 1814 between an opening 704 of the second group 1804 and the top surface 1810. Openings 704 of the second group 1804 are nearer the top surface 1810 than openings 704 of the third group 1806. The distance 1814 between an opening 704 of the second group 1804 and the top surface 1810 is larger than a distance 1816 between an opening 704 of the third group 1806 and the top surface 1810. Openings 704 of the third group 1806 are nearer the top surface 1810 than openings 704 of the fourth group 1808. The distance 1816 between an opening 704 of the third group 1806 and the top surface 1810 is larger than a distance 1818 between an opening 704 of the fourth group 1808 and the top surface 1810. The first group 1802 has any number of openings 704, such as one or more openings. The second group 1804 has any number of openings 704, such as one or more openings. The third group 1806 has any number of openings 704, such as one or more openings. The fourth group 1808 has any number of openings 704, such as one or more openings. In some embodiments, substantially uniform flow and/or distribution of the first gas 140 into the PVD volume 116 occurs among the seventh plurality of groups of openings 704. In some embodiments, flow of the first gas 140 into the PVD volume 116 is greater among openings 704 in one or more upper regions of the gas conducting structure 702 than among openings 704 in one or more lower regions of the gas conducting structure 702. Other configurations of the seventh plurality of groups of openings 704 are within the scope of the present disclosure.

Figure 19:
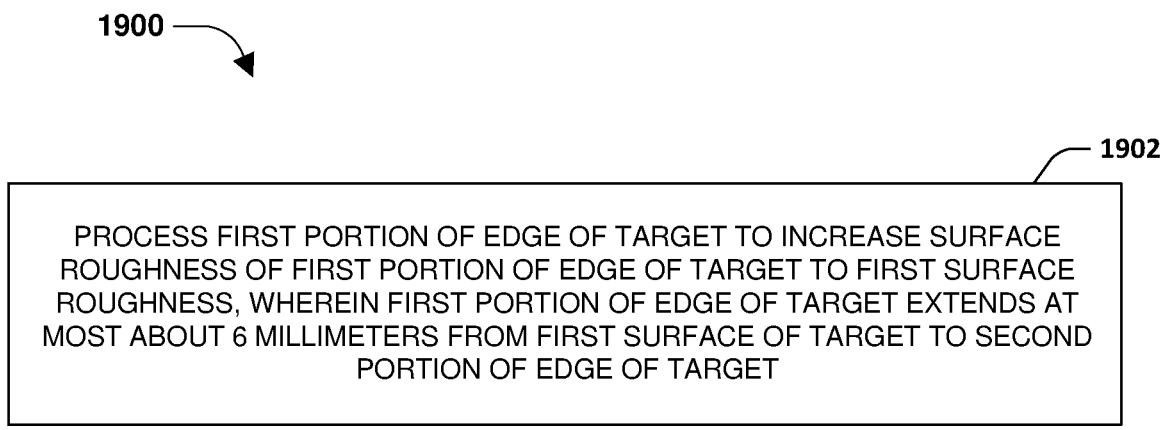
FIG. 19 is a flow diagram illustrating a method, in accordance with some embodiments.

A method 1900 is illustrated in FIG. 19, in accordance with some embodiments. At 1902, a first portion of an edge of a target is processed to increase a surface roughness of the first portion of the edge of the target to a first surface roughness. The target is at least one of the target 102 or other suitable target. The edge of the target is at least one of the edge 108 or other suitable edge. The first portion of the edge of the target is at least one of the first portion 110 or other suitable portion. The edge of the target extends from a first surface of the target to a second surface of the target, opposite the first surface of the target. The first surface of the target is at least one of the first surface 104 or other suitable surface. The second surface of the target is at least one of the second surface 106 or other suitable surface. The first portion of the edge of the target extends at most about 6 millimeters from the first surface of the target to a second portion of the edge of the target. The second portion of the edge of the target is at least one of the second portion 112 or other suitable portion. The first surface roughness of the first portion of the edge is higher than a second surface roughness of the second portion of the edge of the target.

In some embodiments, processing the first portion of the edge of the target comprises at least one of abrasive blasting the first portion of the edge of the target, shot peening the first portion of the edge of the target, knurling the first portion of the edge of the target, or performing other suitable processing method.

In some embodiments, after the processing at 1902, the target is transferred to a PVD chamber, such as at least one of the PVD chamber 150 or other suitable PVD chamber.

In some embodiments, a first gas is introduced to the PVD chamber through an inlet. The first gas is at least one of the first gas 140 or other suitable gas. The inlet is at least one of the inlet 136 or other suitable inlet. The first gas is conducted into a volume defined by the PVD chamber through one or more openings defined in a gas conducting structure in the PVD chamber. The volume is at least one of the PVD volume 116 or other suitable volume. The one or more openings are at least one of the openings 704 or other suitable openings. The gas conducting structure is at least one of the gas conducting structure 702 or other suitable gas conducting structure.

In some embodiments, processing the first portion of the edge of the target is performed based upon the PVD chamber such that a distance between a chamber wall of the PVD chamber and the first portion of the edge of the target is at least a threshold distance. The chamber wall is at least one of the chamber wall 134, the inner chamber wall 122, or other suitable chamber wall. The threshold distance is at least one of the first threshold distance or other suitable threshold distance.

In some embodiments, processing the first portion of the edge of the target is performed based upon at least one of a grain size of the target, a material of the target, a target type of the target, adhesion of the target, or one or more other suitable target characteristics of the target.

In some embodiments, one or more processing methods used for processing the first portion of the edge of the target are selected based upon the grain size of the target. Processing the first portion of the edge of the target comprises performing a first processing method if the grain size of the target exceeds a first threshold grain size. In some embodiments, the first processing method comprises knurling, such as roll knurling or other suitable knurling, the first portion of the edge of the target. Processing the first portion of the edge of the target comprises performing a second processing method if the grain size of the target is less than the first threshold grain size. In some embodiments, the second processing method comprises abrasive blasting, such as low roughness abrasive blasting or other suitable abrasive blasting, the first portion of the edge of the target. The first threshold grain size is between about 50 micrometers to about 70 micrometers. Other values of the first threshold grain size are within the scope of the present disclosure.

In some embodiments, one or more processing methods used for processing the first portion of the edge of the target are selected based upon the adhesion of the target. Processing the first portion of the edge of the target comprises performing a third processing method if the adhesion of the target is less than a first threshold adhesion. In some embodiments, the third processing method comprises shot peening the first portion of the edge of the target, such as using shot and/or melt shot comprising at least one of TiAl or other suitable material.

In some embodiments, a desired surface roughness of the first portion of the edge of the target is selected based upon the grain size of the target. In some embodiments, processing the first portion of the edge of the target is performed based upon the desired surface roughness such that the first surface roughness of the first portion is about equal to or within a threshold range of the desired surface roughness. In some embodiments, the desired surface roughness is between about 1 micrometer to about 10 micrometers (such as between about 3 micrometers to about 8 micrometers, or such as between about 5 micrometers to about 8 micrometers) if the grain size of the target is less than a second threshold grain size. In some embodiments, the desired surface roughness is between about 10 micrometers to about 30 micrometers (such as between about 12 micrometers to about 23 micrometers) if the grain size of the target is larger than the second threshold grain size. The second threshold grain size is between about 50 micrometers to about 70 micrometers. Other values of the second threshold grain size are within the scope of the present disclosure.

In some embodiments, one or more processing methods used for processing the first portion of the edge of the target are selected based upon the desired surface roughness of the first portion of the edge of the target. Processing the first portion of the edge of the target comprises performing a fourth processing method if the desired surface roughness exceeds a first threshold desired surface roughness. In some embodiments, the fourth processing method comprises knurling, such as roll knurling or other suitable knurling, the first portion of the edge of the target. Processing the first portion of the edge of the target comprises performing a fifth processing method if the desired surface roughness is less than the first threshold desired surface roughness. In some embodiments, the fifth processing method comprises abrasive blasting, such as low roughness abrasive blasting or other suitable abrasive blasting, the first portion of the edge of the target.

In some embodiments, a target material of the target is deposited onto a wafer in the PVD chamber, such as during a PVD process performed using the target. The wafer is at least one of the wafer 118 or other suitable wafer.

Figure 20:
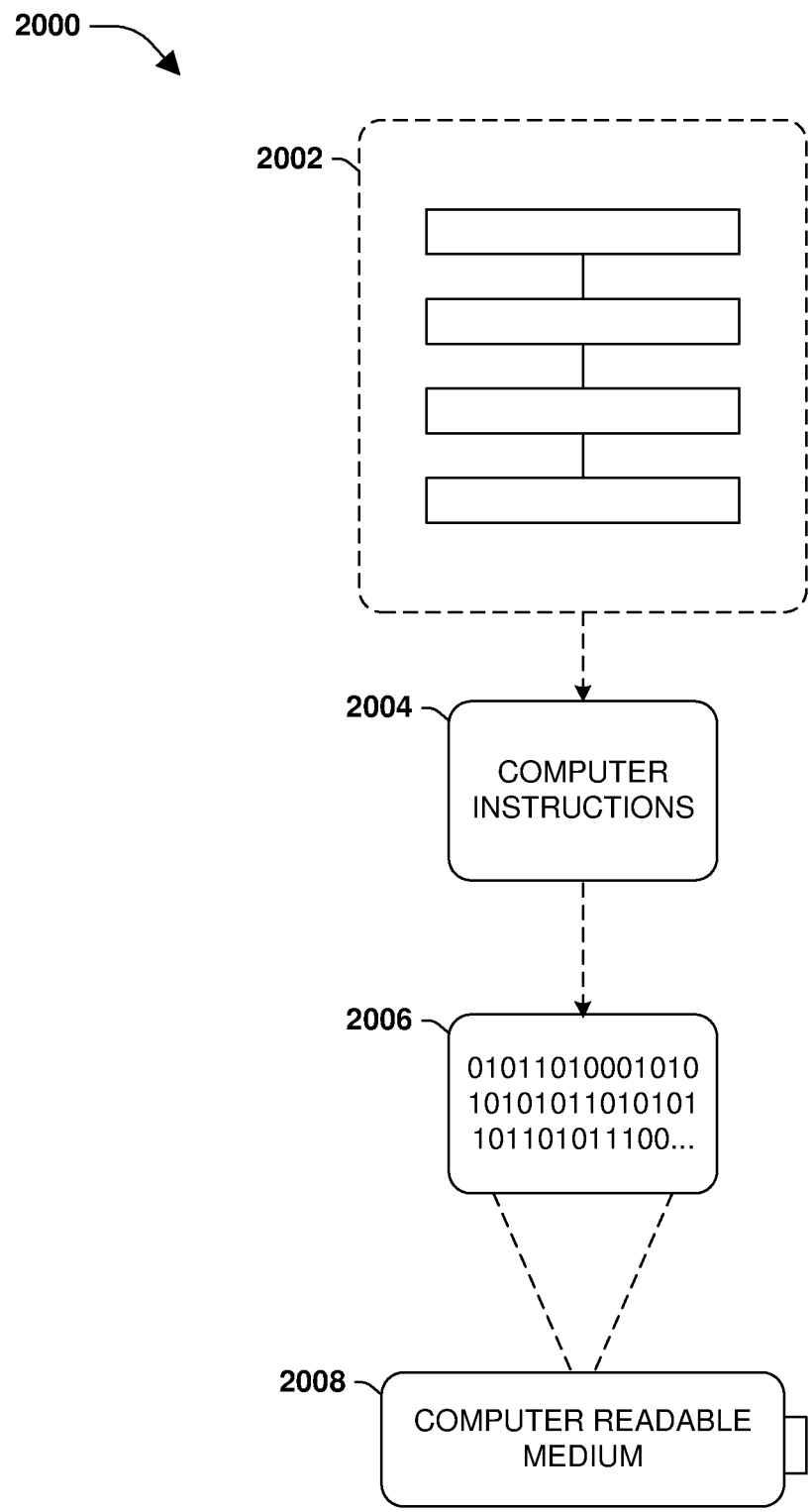
FIG. 20 illustrates an example computer-readable medium wherein processor-executable instructions configured to embody one or more of the provisions set forth herein may be comprised, according to some embodiments.

One or more embodiments involve a computer-readable medium comprising processor-executable instructions configured to implement one or more of the techniques presented herein. An exemplary computer-readable medium is illustrated in FIG. 20, wherein the embodiment 2000 comprises a computer-readable medium 2008 (e.g., a CD-R, DVD-R, flash drive, a platter of a hard disk drive, etc.), on which is encoded computer-readable data 2006. This computer-readable data 2006 in turn comprises a set of processor-executable computer instructions 2004 configured to implement one or more of the principles set forth herein when executed by a processor. In some embodiments 2000, the processor-executable computer instructions 2004 are configured to implement a method 2002, such as at least some of the aforementioned method(s) when executed by a processor. In some embodiments, the processor-executable computer instructions 2004 are configured to implement a system, such as at least some of the one or more aforementioned system(s) when executed by a processor. Many such computer-readable media may be devised by those of ordinary skill in the art that are configured to operate in accordance with the techniques presented herein.

In some embodiments, a PVD system is provided. The PVD system includes a PVD chamber defining a PVD volume within which a target material of a target is deposited onto a wafer. The PVD system includes the target in the PVD chamber. The target is configured to overlie the wafer. An edge of the target extends from a first surface of the target to a second surface of the target, opposite the first surface of the target. A first portion of the edge of the target has a first surface roughness. The first portion of the edge of the target extends at most about 6 millimeters from the first surface of the target to a second portion of the edge of the target. The second portion of the edge of the target has a second surface roughness less than the first surface roughness.

In some embodiments, a PVD system is provided. The PVD system includes a PVD chamber defining a PVD volume within which a target material of a target is deposited onto a wafer. The PVD chamber includes an inlet to introduce a first gas into the PVD chamber. The PVD system includes a shielding structure in the PVD chamber to inhibit dissipation of the first gas from the PVD volume. The PVD system includes a gas conducting structure in the PVD chamber to conduct the first gas into the PVD volume. The gas conducting structure is between a wall of the shielding structure and the wafer.

In some embodiments, a method is provided. The method includes processing a first portion of an edge of a target to increase a surface roughness of the first portion of the edge of the target to a first surface roughness. The edge of the target extends from a first surface of the target to a second surface of the target, opposite the first surface of the target. The first portion of the edge of the target extends at most about 6 millimeters from the first surface of the target to a second portion of the edge of the target. The first surface roughness of the first portion of the edge of the target is higher than a second surface roughness of the second portion of the edge of the target.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one other, such as structural dimensions or orientations, for example, for purposes of simplicity and ease of understanding and that actual dimensions of the same differ substantially from that illustrated herein, in some embodiments. Additionally, a variety of techniques exist for forming the layers, regions, features, elements, etc. mentioned herein, such as at least one of etching techniques, planarization techniques, implanting techniques, doping techniques, spin-on techniques, sputtering techniques, growth techniques, or deposition techniques such as chemical vapor deposition (CVD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A physical vapor deposition (PVD) system, comprising:
    a PVD chamber defining a PVD volume within which a target material of a target is deposited onto a wafer, wherein the PVD chamber comprises an inlet configured to introduce a first gas into the PVD chamber;
    the target disposed in the PVD chamber, wherein:
        the target is configured to overlie the wafer;
        an outermost edge of the target extends from a first surface of the target to a second surface of the target, opposite the first surface of the target;
        a first portion of the outermost edge of the target has a first surface roughness;
        the first portion of the outermost edge of the target extends at most about 6 millimeters from the first surface of the target to a second portion of the outermost edge of the target;
        the second portion of the outermost edge of the target has a second surface roughness less than the first surface roughness; and
        the first portion of the outermost edge and the second portion of the outermost edge are exposed to the PVD volume;
    a shielding structure disposed in the PVD chamber and configured to inhibit dissipation of the first gas from the PVD volume; and
    a gas conducting structure disposed in the PVD chamber and configured to conduct the first gas into the PVD volume, wherein:
        the gas conducting structure is between a wall of the shielding structure and the wafer;
        the shielding structure defines a path from the inlet to the gas conducting structure, the path having at least one curve between the inlet and the gas conducting structure that changes a direction of the first gas;
        the first gas is released into the PVD volume after flowing through the path defined by the shielding structure;
        one or more openings are defined in the gas conducting structure;
        a first opening of the one or more openings extends from an inner sidewall of the gas conducting structure to an outer sidewall of the gas conducting structure opposite the inner sidewall of the gas conducting structure; and
        the inner sidewall faces the PVD volume.

2. The PVD system of claim 1, wherein:
    at a first position along the outermost edge, the first portion of the outermost edge of the target has a first length measured in a direction extending from the first surface to the second surface;
    at a second position along the outermost edge, the first portion of the outermost edge of the target has a second length measured in the direction extending from the first surface to the second surface; and
    the first length is different than the second length.

3. The PVD system of claim 1, wherein:
    a first area of the first portion of the outermost edge of the target extending from the first surface of the target and overlying and extending toward a first area of the second portion of the outermost edge of the target has a first shape;

a second area of the first portion of the outermost edge of the target extending from the first surface of the target and overlying and extending toward a second area of the second portion of the outermost edge of the target has a second shape; and the first shape is different than the second shape.

4. The PVD system of claim 1, wherein:

the first portion of the outermost edge of the target is abrasive blasted to achieve the first surface roughness.

5. The PVD system of claim 1, wherein:

at a first position along the outermost edge, the first portion of the outermost edge of the target extends a first distance from the first surface of the target to the second portion of the outermost edge of the target, the first distance measured in a direction extending from the first surface to the second surface;

at a second position along the outermost edge, the first portion of the outermost edge of the target extends a second distance from the first surface of the target to the second portion of the outermost edge of the target, the second distance measured in the direction extending from the first surface to the second surface; and the first distance is different than the second distance.

6. The PVD system of claim 1, comprising:

a heater disposed in the PVD chamber and configured to heat the wafer.

7. The PVD system of claim 1, wherein the PVD chamber comprises:

a backplane structure overlying the target, wherein the first portion of the outermost edge is disposed below a bottommost surface of the backplane structure.

8. A physical vapor deposition (PVD) system, comprising:

a PVD chamber defining a PVD volume within which a target material of a target is deposited onto a wafer, wherein the PVD chamber comprises an inlet configured to introduce a first gas into the PVD chamber;

a shielding structure disposed in the PVD chamber and configured to inhibit dissipation of the first gas from the PVD volume; and a gas conducting structure disposed in the PVD chamber and configured to conduct the first gas into the PVD volume, wherein:

the gas conducting structure is between a wall of the shielding structure and the wafer;

the shielding structure defines a path from the inlet to the gas conducting structure, the path having at least one curve between the inlet and the gas conducting structure that changes a direction of the first gas;

the first gas is released into the PVD volume after flowing through the path defined by the shielding structure;

one or more openings are defined in the gas conducting structure;

a first opening of the one or more openings extends from an inner sidewall of the gas conducting structure to an outer sidewall of the gas conducting structure opposite the inner sidewall of the gas conducting structure; and the inner sidewall faces the PVD volume.

9. The PVD system of claim 8, wherein:

at least some of the first gas flows through the first opening into the PVD volume.

10. The PVD system of claim 8, wherein:

the one or more openings are at least two openings;

a second opening of the at least two openings extends from the inner sidewall of the gas conducting structure to the outer sidewall of the gas conducting structure;

the first opening has a first shape;

the second opening has a second shape; and the first shape is different than the second shape.

11. The PVD system of claim 8, wherein:

the one or more openings are at least two openings;

a second opening of the at least two openings extends from the inner sidewall of the gas conducting structure to the outer sidewall of the gas conducting structure;

the first opening has a first size;

the second opening has a second size; and the first size is different than the second size.

12. The PVD system of claim 8, wherein:

the one or more openings are at least three openings;

a second opening of the at least three openings extends from the inner sidewall of the gas conducting structure to the outer sidewall of the gas conducting structure;

a third opening of the at least three openings extends from the inner sidewall of the gas conducting structure to the outer sidewall of the gas conducting structure;

the first opening is separated from the second opening by a first distance;

the second opening is separated from the third opening by a second distance; and the first distance is different than the second distance.

13. The PVD system of claim 8, comprising:

a power generator coupled to the PVD chamber to generate a radio frequency (RF) power to establish a plasma in the PVD volume from the first gas.

14. The PVD system of claim 8, comprising:

a wafer support disposed in the PVD chamber to support the wafer disposed in the PVD volume.

15. The PVD system of claim 8, comprising:

the target disposed in the PVD chamber, wherein:

the target is configured to overlie the wafer;

an edge of the target extends from a first surface of the target to a second surface of the target, opposite the first surface of the target;

a first portion of the edge of the target has a first surface roughness;

the first portion of the edge of the target extends at most about 6 millimeters from the first surface of the target to a second portion of the edge of the target; and the second portion of the edge of the target has a second surface roughness less than the first surface roughness.

16. A physical vapor deposition (PVD) system, comprising:

a PVD chamber defining a PVD volume within which a target material of a target is deposited onto a wafer, wherein the PVD chamber comprises an inlet configured to introduce a first gas into the PVD chamber;

a backplane structure to which the target is coupled;

the target disposed in the PVD chamber, wherein:

an edge of the target extends from a first surface of the target facing towards the backplane structure to a second surface of the target facing a wafer support for supporting the wafer;

a thickness of the target increases from a first intersection of the edge and the first surface to a second intersection of the edge and the second surface;

a first portion of the edge of the target has a first surface roughness;

a second portion of the edge of the target has a second surface roughness less than the first surface roughness; and the first portion of the edge and the second portion of the edge are exposed below the backplane structure;

a shielding structure disposed in the PVD chamber and configured to inhibit dissipation of the first gas from the PVD volume; and a gas conducting structure disposed in the PVD chamber and configured to conduct the first gas into the PVD volume, wherein:

the gas conducting structure is between a wall of the shielding structure and the wafer;

the shielding structure defines a path from the inlet to the gas conducting structure, the path having at least one curve between the inlet and the gas conducting structure that changes a direction of the first gas;

the first gas is released into the PVD volume after flowing through the path defined by the shielding structure;

one or more openings are defined in the gas conducting structure;

a first opening of the one or more openings extends from an inner sidewall of the gas conducting structure to an outer sidewall of the gas conducting structure opposite the inner sidewall of the gas conducting structure; and the inner sidewall faces the PVD volume.

17. The PVD system of claim 16, wherein the second portion of the edge is between the first portion of the edge and the second surface of the target.

18. The PVD system of claim 16, wherein the edge and the second surface intersect at an angle other than 90 degrees.

19. The PVD system of claim 16, wherein the edge and the second surface intersect at an obtuse angle.

20. The PVD system of claim 16, wherein:

at least some of the first gas flows through the first opening into the PVD volume.

* * * * *